US008949683B1

(12) United States Patent
Sun et al.

(10) Patent No.: US 8,949,683 B1
(45) Date of Patent: Feb. 3, 2015

(54) ADAPTIVE SUCCESSIVE INTERFERENCE CANCELLATION RECEIVERS

(71) Applicant: Marvell International Ltd., Hamilton (BM)

(72) Inventors: Yakun Sun, Sunnyvale, CA (US); Jihwan P. Choi, San Jose, CA (US); Jiwoong Choi, Sunnyvale, CA (US); Hui-Ling Lou, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/242,091

(22) Filed: Apr. 1, 2014

Related U.S. Application Data

(63) Continuation of application No. 13/210,812, filed on Aug. 16, 2011, now Pat. No. 8,694,851.

(60) Provisional application No. 61/374,509, filed on Aug. 17, 2010.

(51) Int. Cl.
*H03M 13/00* (2006.01)
*H04L 1/00* (2006.01)
*H03M 13/29* (2006.01)
*H03M 13/09* (2006.01)
*H03M 13/37* (2006.01)

(52) U.S. Cl.
CPC ............ *H04L 1/0054* (2013.01); *H03M 13/29* (2013.01); *H03M 13/09* (2013.01); *H03M 13/3776* (2013.01)
USPC ........................................................ 714/758

(58) Field of Classification Search
CPC ............ H03M 13/29; H03M 13/3776; H03M 13/3746; H03M 13/09; H04L 1/0048
USPC ................... 714/746, 755, 758, 763; 375/262
See application file for complete search history.

(56) References Cited

U.S. PATENT DOCUMENTS

| | | | |
|---|---|---|---|
| 6,584,115 B1 | 6/2003 | Suzuki | |
| 7,924,933 B2 * | 4/2011 | Prasad et al. | 375/262 |
| 8,149,957 B2 | 4/2012 | Oh et al. | |
| 8,185,798 B2 * | 5/2012 | Oteri et al. | 714/758 |
| 8,335,286 B2 * | 12/2012 | Mergen et al. | 375/350 |
| 8,687,751 B1 | 4/2014 | Lee et al. | |
| 2005/0063378 A1 | 3/2005 | Kadous | |
| 2008/0297415 A1 | 12/2008 | Berens et al. | |
| 2009/0225889 A1 | 9/2009 | Tsai et al. | |
| 2011/0268019 A1 | 11/2011 | Tang et al. | |

* cited by examiner

*Primary Examiner* — Shelly A Chase

(57) ABSTRACT

A system including a first receiver to receive a first signal including a first set of codewords and to generate a first set of decoded codewords by decoding one or more codewords of the first set of codewords. A first interference canceller measures first reliability metrics of codewords corresponding to the first set of decoded codewords and selects a second set of decoded codewords from the first set of decoded codewords based on the first reliability metrics. An encoder generates an encoded signal by encoding the second set of decoded codewords. A modulator generates a second signal by modulating the encoded signal. A subtractor subtracts a portion of the second signal from the first signal to cancel interference of first codewords corresponding to the second set of decoded codewords on codewords other than the first codewords in the first set of codewords in the first signal.

20 Claims, 16 Drawing Sheets

| Iteration number i | S(i) | Cancelled signal | Codeword 1 | Codeword 2 | Codeword 3 | Codeword 4 | Codeword 5 | # of decoding |
|---|---|---|---|---|---|---|---|---|
| 1 | {1,3,5} | y | F (Fail) | P (Pass) | F | P | F | 5 |
| 2 | {1,3} | $y - H_2x_2 - H_4x_4$ | F | x (No decoding) | F | x | P | 3 |
| 3 | {1} | $y - H_2x_2 - H_4x_4 - H_5x_5$ | F | x | P | x | x | 2 |
| 4 | {1} | $y - H_2x_2 - H_4x_4 - H_5x_5 - H_3x_3$ | F | x | x | x | x | 1 |
| Final | | | P | P | P | P | P | Total: 11 |

End of decoding

| k Before | k After | Trigger index Before | Trigger index After | Decoding outcome | S(i) | Cancelled signal | Code word 1 | Code word 2 | Code word 3 | Code word 4 | Code word 5 | # of decoding |
|---|---|---|---|---|---|---|---|---|---|---|---|---|
| 1 | 2 | 0 | 0 | F | {1,2,3,4,5} | y | F (Fail) | | | | | 1 |
| 2 | 3 | 0 | 3 | P | {1,3,4,5} | y | | P (Pass) | | | | 1 |
| 3 | 4 | 3 | 3 | F | {1,3,4,5} | y-H$_2$x$_2$ | | | F | | | 1 |
| 4 | 5 | 3 | 5 | P | {1,3,5} | y-H$_2$x$_2$ | | | | P* | | 1 |
| 5 | 1 | 5 | 1 | P | {1,3} | y-H$_2$x$_2$-H$_4$x$_4$ | | | | | P | 1 |
| 1 | 3 | 1 | 1 | F | {1,3} | y-H$_2$x$_2$-H$_4$x$_4$-H$_5$x$_5$ | F | | | | | 1 |
| 3 | 1 | 1 | 1 | P | {1} | y-H$_2$x$_2$-H$_4$x$_4$-H$_5$x$_5$ | F | | P | P | | 1 |
| 1 | 1 | 1 | 1 | F | {1} | y-H$_2$x$_2$-H$_4$x$_4$-H$_5$x$_5$-H$_3$x$_3$ | F | P | P | P | P | 1 |
| | | | | | | | | | | | Total: | 8 |

If '=' then End of decoding when 'F' then End of decoding

FIG. 6B

ADAPTIVE SUCCESSIVE INTERFERENCE CANCELLATION RECEIVERS

CROSS-REFERENCE TO RELATED APPLICATIONS

This application is a continuation of U.S. application Ser. No. 13/210,812 (now U.S. Pat. No. 8,694,851), filed on Aug. 16, 2011 which claims the benefit of U.S. Provisional Application No. 61/374,509, filed on Aug. 17, 2010. The disclosures of the above applications are incorporated herein by reference in its entirety.

This present disclosure is related to U.S. application Ser. No. 14/226,037 filed Mar. 26, 2014 which is a continuation of U.S. application Ser. No. 13/047,056, (now U.S. Pat. No. 8,687,751), filed Mar. 14, 2011.

The disclosures of the applications referenced above are incorporated herein by reference.

FIELD

The present disclosure relates generally to communication systems and more particularly to adaptive multiple-input multiple-output successive interference cancellation receivers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Many wireless communication systems use multiple transmit antennas and receive antennas and are modeled as multiple-input multiple-output (MIMO) systems. MIMO systems can increase throughput by transmitting multiple streams over multiple transmit antennas. Examples of MIMO wireless communication systems (referred to herein also as "MIMO systems") include wireless fidelity (WiFi) systems, Worldwide Interoperability for Microwave Access (WiMAX) systems, Long Term Evolution (LTE) systems, and so on.

In MIMO systems, transmitters may generate multiple streams using one or more channel encoders. For example, in WiMAX MIMO systems using two transmit antennas, transmitters may generate two streams using one channel encoder. In LTE MIMO systems using two transmit antennas, transmitters may generate two streams using two channel encoders.

Receivers of most wireless communication systems typically use cyclic redundancy check (CRC) codes to detect errors at a physical layer (PHY) or a medium access control (MAC) layer. For example, CRC codes are used to determine whether received packets are decoded correctly. Additionally, receivers may use successive interference cancellation (SIC) when multiple streams are generated using multiple channel encoders.

SUMMARY

A system includes a first receiver module and a first interference canceller module. The first receiver module is configured to receive a first signal including a first set of codewords and to generate a first set of decoded codewords by decoding at least one of the first set of codewords. The first interference canceller module is configured to measure first reliability metrics of codewords corresponding to the first set of decoded codewords; based on the first reliability metrics, select a second set of decoded codewords from the first set; generate a second signal based on the second set of decoded codewords; and subtract at least a portion of the second signal from the first signal to cancel interference of codewords corresponding to the second set of decoded codewords on the second set of codewords in the first signal.

A system includes a first receiver module and a first interference canceller module. The first receiver module is configured to receive a first signal including a first set of codewords and to generate a first decoded codeword by decoding one codeword from the first set of codewords. The first interference canceller module is configured to measure a first reliability metric of the first decoded codeword; based on the first reliability metric, generate a second signal based on the first decoded codeword; subtract at least a portion of the second signal from the first signal; cancel interference of the first decoded codeword on a second set of codewords, and generate a third signal. The second set of codewords (i) includes the first set of codewords and (ii) excludes the first decoded codeword. The third signal (i) includes the first set of codewords and (ii) excludes the first decoded codeword.

A system includes a first receiver module and a first interference canceller module. The first receiver module is configured to receive a first signal, wherein the first signal includes a first set of codewords and to generate a first set of decoded codewords by decoding the first set of codewords. The first interference canceller module is configured to measure first reliability metrics corresponding to the first set of decoded codewords; based on the first reliability metrics, generate a second signal based on at least a first decoded codeword from the first set of decoded codewords; subtract at least a portion of the second signal from the first signal; cancel interference of at least the first decoded codeword on a second set of codewords; and generate a third signal. The second set of codewords (i) includes the first set of codewords and (ii) excludes at least the first decoded codeword. The third signal includes the second set of codewords.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 6B is an example showing decoding of five codewords using a serial SIC receiver according to the method shown in FIG. 6A;

For purposes of clarity, the same reference numbers will be used throughout the drawings to identify similar elements.

DESCRIPTION

The present disclosure relates to adaptive multiple-input multiple-output (MIMO) successive interference cancellation (SIC) receivers. The adaptive MIMO SIC receivers use feedback (e.g., regenerated transmit signals generated based on previously decoded codewords) for interference cancellation (e.g., to cancel interference due to the previously decoded codewords from the received signal). The feedback can be turned on or off by comparing reliability of the feedback with a predetermined threshold. The reliability can be measured in many ways. The predetermined threshold can be set for each codeword and/or each decoding stage of the receiver. The feedback can be adjusted (e.g., scaled) based on reliability of the feedback.

The disclosure is organized as follows. First, a system model for a transmitter and channel and a system model for a received signal are introduced. Subsequently, a non-SIC receiver and a general SIC receiver are described. Thereafter, a parallel SIC receiver and a serial SIC receiver utilizing cyclic redundancy check (CRC) are described. Finally, threshold-based and scaled-feedback-based adaptive MIMO SIC receivers are disclosed.

Figure 1:
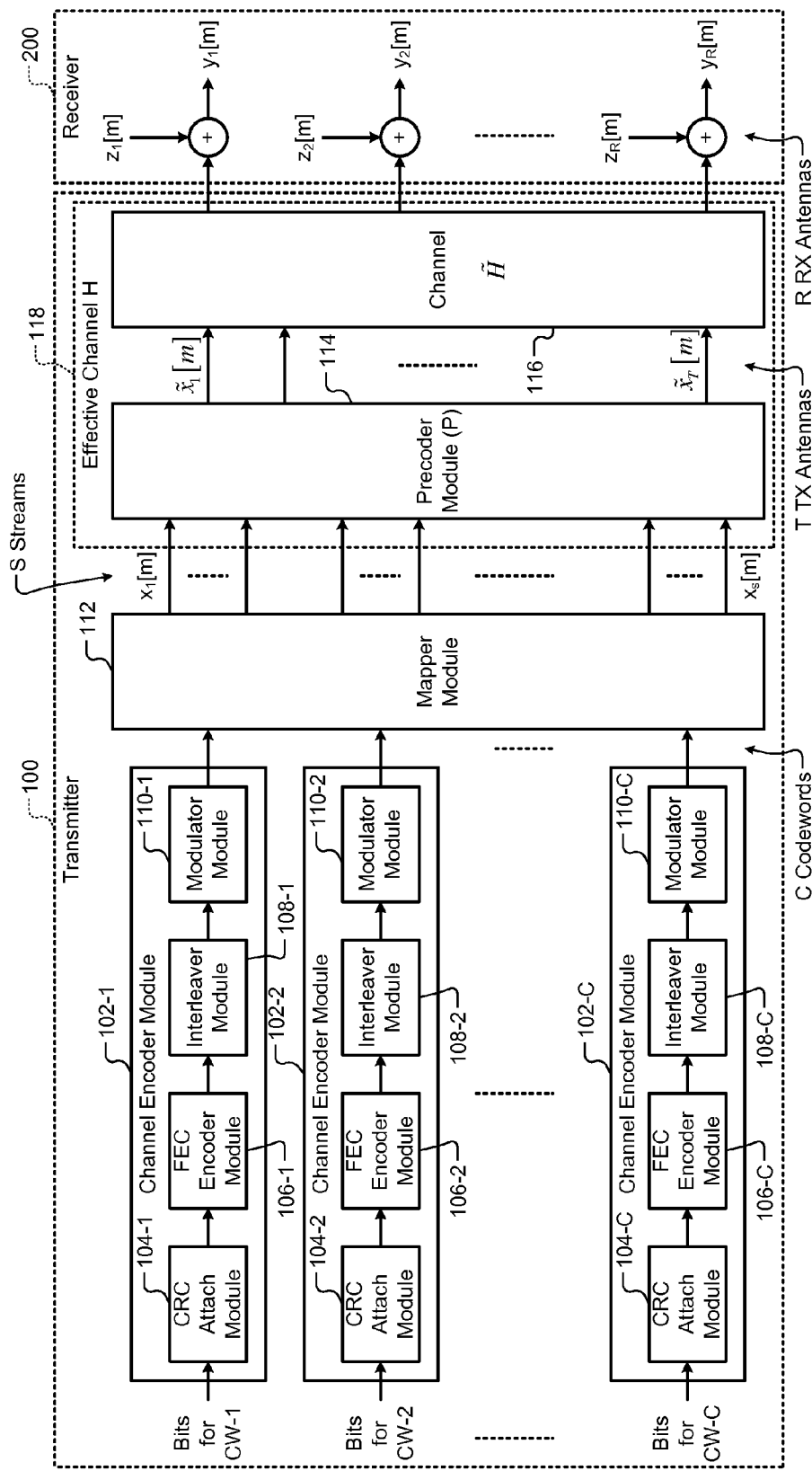
FIG. 1 is a functional block diagram of a system including a wireless transmitter having a plurality of transmit antennas and a wireless receiver having a plurality of receive antennas.

Referring now to FIG. 1, a system model for a transmitter and channel is shown. A transmitter 100 generates multiple streams (e.g., S streams, where S is an integer greater than 1) using multiple channel encoders. The transmitter 100 transmits the multiple streams via multiple transmit antennas (e.g., T transmit antennas, where T is an integer greater than 1). A receiver 200 receives the multiple streams via multiple receive antennas (e.g., R receive antennas, where R is an integer greater than 1).

The transmitter 100 includes a plurality of channel encoder modules 102-1, 102-2, ..., 102-C (collectively channel encoder modules 102), where C is an integer greater than 1. The channel encoder modules 102 receive information bits of C codewords and generate C codewords, respectively. That is, the channel encoder module 102-1 receives information bits of a codeword CW-1 and generates the codeword CW-1; the channel encoder 102-2 module receives information bits of a codeword CW-2 and generates the codeword CW-2; and so on. The channel encoder module 102-C receives information bits of a codeword CW-C and generates the codeword CW-C.

Each of the channel encoder modules 102 includes a forward error correction (FEC) encoder module, an interleaver module, and a modulator module. In some implementations, the channel encoder modules 102 may also include a CRC attach module. For example, the channel encoder module 102-1 includes a CRC attach module 104-1, a FEC encoder module 106-1, an interleaver module 108-1, and a modulator module 110-1. The channel encoder module 102-2 includes a CRC attach module 104-2, a FEC encoder module 106-2, an interleaver module 108-2, and a modulator module 110-2, and so on. The channel encoder module 102-C includes a CRC attach module 104-C, a FEC encoder module 106-C, an interleaver module 108-C, and a modulator module 110-C.

The CRC attach modules 104-1, 104-2, ..., and 104-C are collectively referred to as CRC attach modules 104. The FEC encoder modules 106-1, 106-2, ..., and 106-C are collectively referred to as FEC encoder modules 106. The interleaver modules 108-1, 108-2, ..., and 108-C are collectively referred to as interleaver modules 108. The modulator modules 110-1, 110-2, ..., and 110-C are collectively referred to as modulator modules 110.

The CRC attach modules 104 use a CRC code to generate CRC information for the codewords and attach the CRC information to the codewords. That is, the CRC attach module 104-1 generates CRC information for the codeword CW-1 using the CRC code and attaches the CRC information to the codeword CW-1; the CRC attach module 104-2 generates CRC information for the codeword CW-2 using the CRC code and attaches the CRC information to the codeword CW-2, and so on. The CRC attach module 104-C generates CRC information for the codeword CW-C using the CRC code and attaches the CRC information to the codeword CW-C.

The FEC encoder modules 106 encode the information bits, and the CRC information if available, of the codewords using a forward error-correction code (FEC). That is, the FEC encoder module 106-1 encodes the information bits and the CRC information of the codeword CW-1 using the FEC; the FEC encoder module 106-2 encodes the information bits and the CRC information of the codeword CW-2 using the FEC, and so on. The FEC encoder module 106-C encodes the information bits and the CRC information of the codeword CW-C of the codeword CW-C using the FEC.

The interleaver modules 108 interleave outputs of the FEC encoder modules 106. That is, the interleaver module 108-1 interleaves an output of the FEC encoder module 106-1; the interleaver module 108-2 interleaves an output of the FEC encoder module 106-2, and so on. The interleaver module 108-C interleaves an output of the FEC encoder module 106-C.

The modulator modules 110 modulate outputs of the FEC encoder modules 106 using a suitable modulation and generate C modulated codewords. That is, the modulator module 110-1 modulates an output of the interleaver module 108-1 and generates a first modulated codeword; the modulator module 110-2 modulates an output of the interleaver module 108-2 and generates a second modulated codeword, and so on. The modulator module 110-C modulates an output of the interleaver module 108-C and generates a $C^{th}$ modulated codeword.

The transmitter 100 further includes a mapper module 112 and a precoder module 114. The mapper module 112 maps the C modulated codewords onto the S streams and generates the S streams. $S_n$ denotes the number of streams in a codeword CW-n. The precoder module 114 maps the S streams onto the T transmit antennas and generates transmit signals.

In MIMO systems, S is greater than or equal to C, and T and R are greater than or equal to S. In systems using super-position coding, S is less than C since multiple codewords are transmitted in a stream. Throughout the present disclosure, MIMO systems are used for example only. The teachings of the present disclosure can also be applied to systems using super-position coding. For example, the mapper module 112 uses a matrix multiplication to map the C modulated codewords onto the S streams. The matrix multiplication can also be used in systems using super-position coding.

The transmitter 100 transmits the transmit signals via the T transmit antennas through a channel 116 denoted by $\tilde{H}$. The precoder module 114 and the channel 116 are collectively referred to as an effective channel 118 denoted by H. The receiver 200 receives signals (referred to as received signals) via the R receive antennas.

A received signal y received by the receiver 200 via the R receive antennas can be mathematically expressed using the following equation:

$$y = Hx + z = \sum_{i=1}^{C} H_i x_i + z$$

where $$y = \begin{bmatrix} y_1 \\ y_2 \\ \vdots \\ y_R \end{bmatrix}, H = \begin{bmatrix} h_{1,1} & h_{1,2} & \cdots & h_{1,S} \\ h_{2,1} & h_{2,2} & \cdots & h_{2,S} \\ \vdots & \vdots & \ddots & \vdots \\ h_{R,1} & h_{R,2} & \cdots & h_{R,S} \end{bmatrix} = \tilde{H}P, x = \begin{bmatrix} x_1 \\ x_2 \\ \vdots \\ x_S \end{bmatrix}, \text{and } z = \begin{bmatrix} z_1 \\ z_2 \\ \vdots \\ z_R \end{bmatrix}.$$

In the above equation, $y_1, y_2, \ldots,$ and $y_R$ are signals received by the R antennas. H, the effective channel, is a R×S matrix and is a product of a R×T channel matrix of the channel $\tilde{H}$ and a T×S matrix representing mapping performed by the precoder module 114. Additionally, x is the transmit signal including transmit symbols $x_1, x_2, \ldots,$ and $x_S$; and z is the circularly symmetric Gaussian noise in the effective channel H. While x is the transmit signal transmitted at time m, a time index m is omitted for notational convenience since the receiver 200 processes the received signal y on a symbol-by-symbol basis (or on a per sub-carrier basis in case of orthogonal frequency division multiplexing (OFDM)).

In other words, the received signal with grouping of streams for each codeword is expressed as $$y = Hx + z = \sum_{i=1}^{C} H_i x_i + z.$$

A transmit vector for streams in a codeword CW-n is expressed by the equation $$x_n = \begin{bmatrix} x_{1,n} \\ x_{2,n} \\ \vdots \\ x_{S_n,n} \end{bmatrix}.$$

The effective channel for the streams in the codeword CW-n is expressed by the equation $$H_n = \begin{bmatrix} h_{1,1,n} & h_{1,2,n} & \cdots & h_{1,S_n,n} \\ h_{2,1,n} & h_{2,2,n} & \cdots & h_{2,S_n,n} \\ \vdots & \vdots & \ddots & \vdots \\ h_{R,1,n} & h_{R,2,n} & \cdots & h_{R,S_n,n} \end{bmatrix} = \tilde{H}P_n,$$

where $P_n$ is a T×$S_n$ precoding matrix for the streams in the codeword CW-n.

Figure 2:
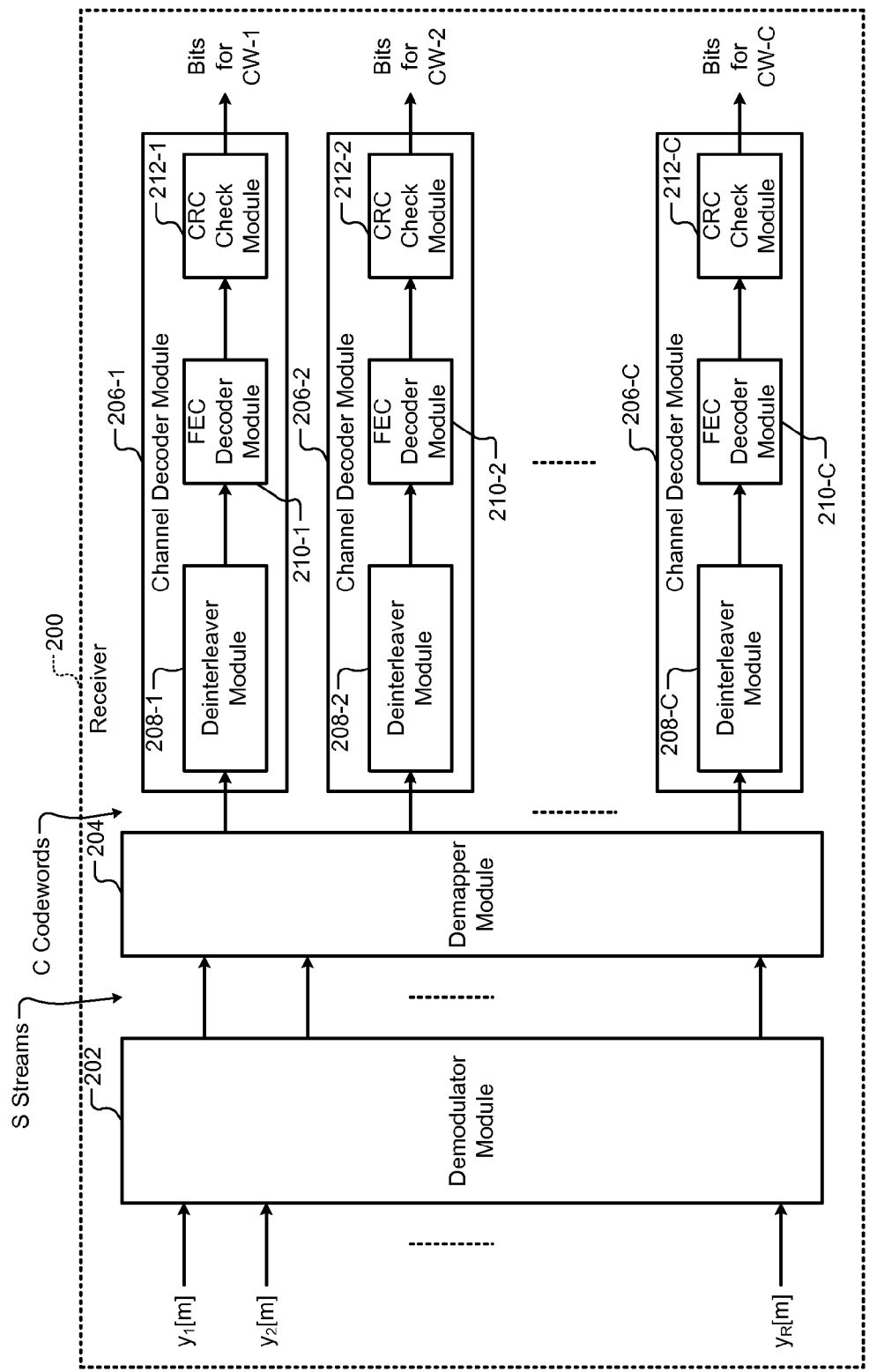
FIG. 2 is a functional block diagram of a receiver that does not utilize successive interference cancellation (SIC)

Referring now to FIG. 2, an example of the receiver 200 is shown. The receiver does not use successive interference cancellation (SIC). The receiver 200 includes a demodulator module 202, a demapper module 204, and a plurality of channel decoder modules 206-1, 206-2, . . . , and 206-C (collectively channel decoder modules 206).

The demodulator module 202 demodulates the received signals received via the R receive antennas. For example, the demodulator module 202 may use a maximum likelihood (ML) demodulator to generate a log likelihood ratio (LLR) for each stream. Alternatively, the demodulator module 202 may use a modulator based on a linear equalizer (e.g., zero-forcing (ZF) equalizer or linear minimum mean square error (MMSE) equalizer) to generate the LLR for each stream.

An LLR is a logarithm of a ratio of a first probability to a second probability. The first probability is a probability that the transmitted encoded bit is a 1 given the received signal. The second probability is a probability that the transmitted encoded bit is a 0 given the received signal. The transmitted encoded bit is a 1 if the LLR is +∞. The transmitted encoded bit is a 0 if the LLR is −∞. Determining whether the received encoded bit is a 1 or a 0 is uncertain if the LLR is nearly 0.

The demapper module 204 demaps the S streams to C codewords and generates LLRs for C codewords. The demapper module 204 directs the LLR for each encoded bit to one of the channel decoder modules 206. The channel decoder modules 206 decode the C codewords and generate information bits of the C codewords, respectively. That is, the channel decoder module 206-1 receives the LLRs for codeword CW-1 from the demapper module 204 and generates information bits of the codeword CW-1; the channel decoder module 206-2 receives the LLRs for codeword CW-2 from the demapper module 204 and generates information bits of the codeword CW-2; and so on. The channel decoder module 206-C receives the LLRs for codeword CW-C from the demapper module 204 and generates information bits of the codeword CW-C.

Each of the channel decoder modules 206 includes a deinterleaver module and a FEC decoder module. In some implementations, the channel decoder may also include a CRC check module. For example, the channel decoder module 206-1 includes a deinterleaver module 208-1, a FEC decoder module 210-1, and a CRC check module 212-1. The channel decoder module 206-2 includes a deinterleaver module 208-2, a FEC decoder module 210-2, and a CRC check module 212-2, and so on. The channel decoder module 206-C includes a deinterleaver module 208-C, a FEC decoder module 210-C, and a CRC check module 212-C.

The deinterleaver modules 208-1, 208-2, . . . , and 208-C are collectively referred to as deinterleaver modules 208. The FEC decoder modules 210-1, 210-2, . . . , and 210-C are collectively referred to as FEC decoder modules 210. The CRC check modules 212-1, 212-2, . . . , and 212-C are collectively referred to as CRC check modules 212.

The deinterleaver modules 208 deinterleave the codewords received from the demapper module 204. The FEC decoder modules 210 decode the outputs of the deinterleave modules 208 and generate information bits of the codewords. The FEC decoder modules 210 correct most errors using the forward error-correction code (FEC) used by the transmitter 100. In implementations that include CRC attach modules and CRC check modules, to detect any uncorrected errors, the CRC check modules 212 perform a CRC operation on the information bits. If no error is detected, the receiver 200 sends an acknowledgement to the transmitter 100 that the transmitted data is received correctly. If an error is detected, the receiver 200 transmits a retransmission request to the transmitter 100 to retransmit the data that was received incorrectly.

Figure 3A:
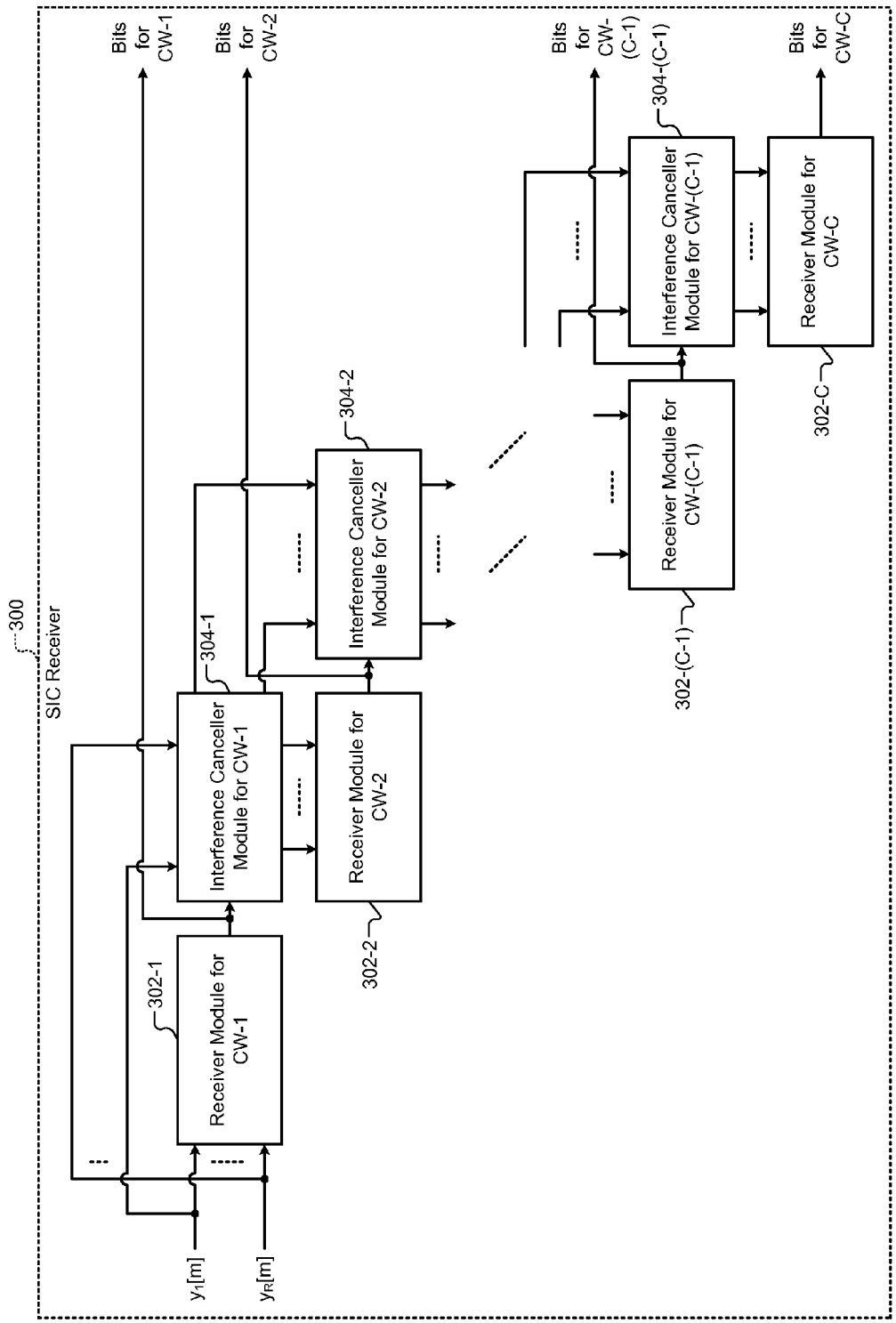
FIG. 3A is a functional block diagram of a receiver that performs successive interference cancellation (SIC) using a plurality of receiver modules and a plurality of interference cancellation modules.
Figure 3B:
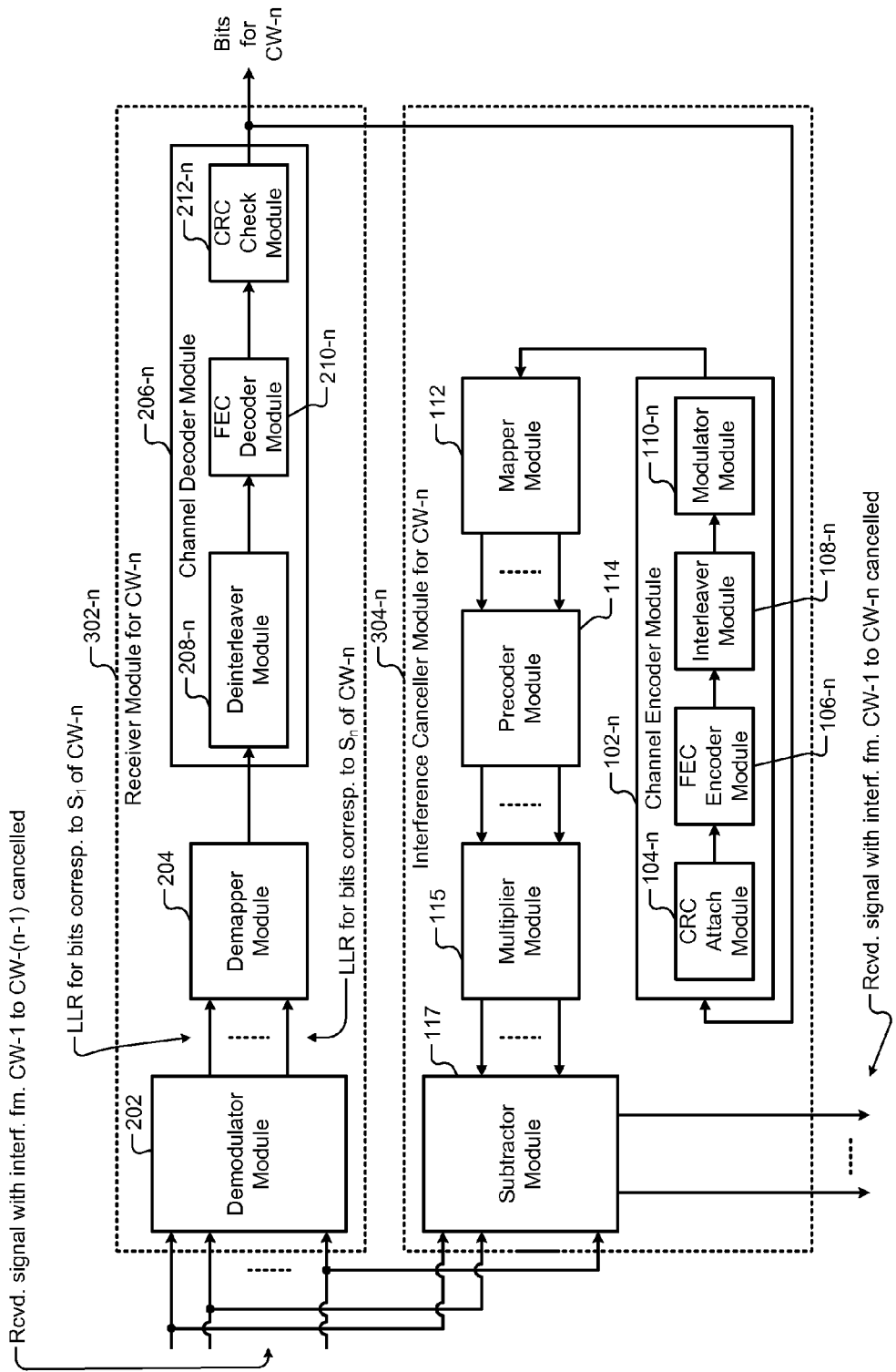
FIG. 3B is a functional block diagram showing details of a receiver module and an interference cancellation module of the receiver of FIG. 3A.

Referring now to FIGS. 3A and 3B, an example of a receiver 300 that uses successive interference cancellation (SIC) is shown. In FIG. 3A, the receiver 300 includes a plurality of receiver modules 302-1, 302-2, . . . , and 302-C (collectively receiver modules 302) and a plurality of interference canceller modules 304-1, 304-2, . . . , and 304-(C-1) (collectively interference canceller modules 304). In general, to decode C codewords from a signal received by the receiver 300, the receiver 300 includes C receiver modules 302 and (C-1) interference canceller modules 304.

The receiver module 302-1 receives received signals $y_1$, $y_2, \ldots,$ and $y_R$. The receiver module 302-1 decodes codeword CW-1. The interference canceller module 304-1 cancels interference caused by the codeword CW-1 on codewords CW-2 through CW-C as explained below with reference to FIG. 3B. The interference canceller module 304-1 generates a first output that does not include interference of codeword CW-1 on codewords CW-2 through CW-C.

The receiver module 302-2 receives the first output of the interference canceller module 304-1 and decodes codeword CW-2 from the first output. The interference canceller module 304-2 cancels interference caused by the codeword CW-2 on codewords CW-3 through CW-C and generates a second output that does not include interference of codewords CW-1 and CW-2 on codewords CW3 through CW-C, and so on.

The receiver module 302-(C-1) receives an output of an interference canceller module 304-(C-2) and decodes codeword CW-(C-1). The interference canceller module 304-(C-1) cancels interference caused by codeword CW-(C-1) on codeword CW-C and generates an output that does not include interference of codewords CW-1 through CW-(C-1) on codeword CW-C. The receiver module 302-C receives the output of the interference canceller module 304-(C-1) and decodes the codeword CW-C.

In FIG. 3B, one of the receiver modules 302 (e.g., receiver module 302-$n$ for codeword CW-n) and one of the interference canceller modules 304 (e.g., interference canceller module 304-$n$ for codeword CW-n) are shown. The receiver module 302-$n$ includes the demodulator module 202, the demapper module 204, and a channel decoder module 206-$n$.

The channel decoder module 206-$n$ is similar to the channel decoder modules 206. The channel decoder module 206-$n$ includes a deinterleaver module 208-$n$, a FEC decoder module 210-$n$, and a CRC check module 212-$n$, which are similar to the deinterleaver modules 208, the FEC decoder modules 210, and the CRC check modules 212, respectively. In some implementations, the CRC check module 212-$n$ may be optional in the channel decoder module 206-$n$.

The receiver module 302-$n$ receives the received signals $y_1$, $y_2, \ldots,$ and $y_R$ if n=1. Alternatively, the receiver module 302-$n$ receives an output of an interference canceller module 304-($n$-1) if n is not equal to 1. In other words, when n is not equal to 1, the receiver module 302-$n$ receives the received signals without the interference from codewords CW-1 through CW-(n-1). That is, when n is not equal to 1, the receiver module 302-$n$ receives signals with interference from codewords CW-1 through CW-(n-1) cancelled from the received signals.

The demodulator module 202 demodulates streams 1 through $S_n$ of codeword CW-n and generates bit LLRs corresponding to each of the streams 1 through $S_n$ of codeword CW-n. The demapper module 204 operates as described with reference to FIG. 2. Based on the output of the demapper module 204, the channel decoder module 206-$n$ decodes codeword CW-n from inputs received by the receiver module 302-$n$. The channel decoder module 206-$n$ outputs information bits of the codeword CW-n.

The interference canceller module 304-$n$ receives the information bits of codeword CW-n. The interference canceller module 304-$n$ includes a channel encoder module 102-$n$, which is similar to the channel encoder modules 102 shown in FIG. 1, the mapper module 112, the precoder module 114, a multiplier module 115, and a subtractor module 117.

The channel encoder module 102-$n$ includes a CRC attach module 104-$n$, a FEC encoder module 106-$n$, an interleaver module 108-$n$, and a modulator module 110-$n$, which are similar to the CRC attach modules 104, the FEC encoder modules 106, the interleaver modules 108, and the modulator modules 110, respectively. The CRC attach module 104-$n$ may be optional in the channel encoder module 102-$n$ and is included in the channel encoder module 102-$n$ when the CRC check module 212-$n$ is included in the channel decoder module 206-$n$.

The channel encoder module 102-$n$ re-encodes the information bits of codeword CW-n decoded by the channel decoder module 206-$n$. The re-encoding can be performed irrespective of whether the CRC check module 212-$n$ detects an error in the codeword CW-n decoded by the FEC decoder module 210-$n$. Additionally, the receiver 300 sends an acknowledgement to the transmitter indicating that the transmitted data is received correctly if no error is detected, and the receiver 300 transmits a retransmission request to the transmitter to retransmit the data that was received incorrectly if an error is detected.

The mapper module 112 and the precoder module 114 operate as described with reference to FIG. 1. Based on the output of the mapper module 112, the precoder module 114 performs stream-to-transmit antenna mapping for streams 1 through $S_n$ of codeword CW-n. The multiplier module 115 multiplies the outputs of the mapper module 114 by a channel estimate matrix H. The multiplier module 115 may obtain the channel estimate matrix based on channel gain of the received signals.

The subtractor module 117 receives the inputs received by the receive module 302-$n$, subtracts the output of the multiplier module 115 from the inputs, and outputs received signals without interference from codewords CW-1 through CW-n. That is, the subtractor module 117 outputs signals with interference from codewords CW-1 through CW-n cancelled from the received signals received by the receiver 300.

Throughout the present disclosure, codewords are referenced as CW-1 through CW-C. The order of processing the codewords, however, may not be sequential. The codewords can be processed in any order including sequentially. The order of processing the codewords can be based on factors including but not limited to channel quality of each codeword.

SIC receivers can suffer from error propagation. For example, when a codeword is incorrectly decoded, an erroneous feedback generated based on the incorrectly decoded codeword may be used for interference cancellation, which can degrade receiver performance. SIC feedback can be adapted to alleviate the error propagation. For example, an adaptive SIC can use CRC-based SIC to stop error propagation. Receivers can utilize CRC information generated by the CRC check module (i.e., whether or not a codeword is decoded correctly and passes CRC) before performing successive interference cancellation. Two types of receivers are presented below: a parallel SIC receiver using CRC and a serial SIC receiver using CRC.

Figure 4A:
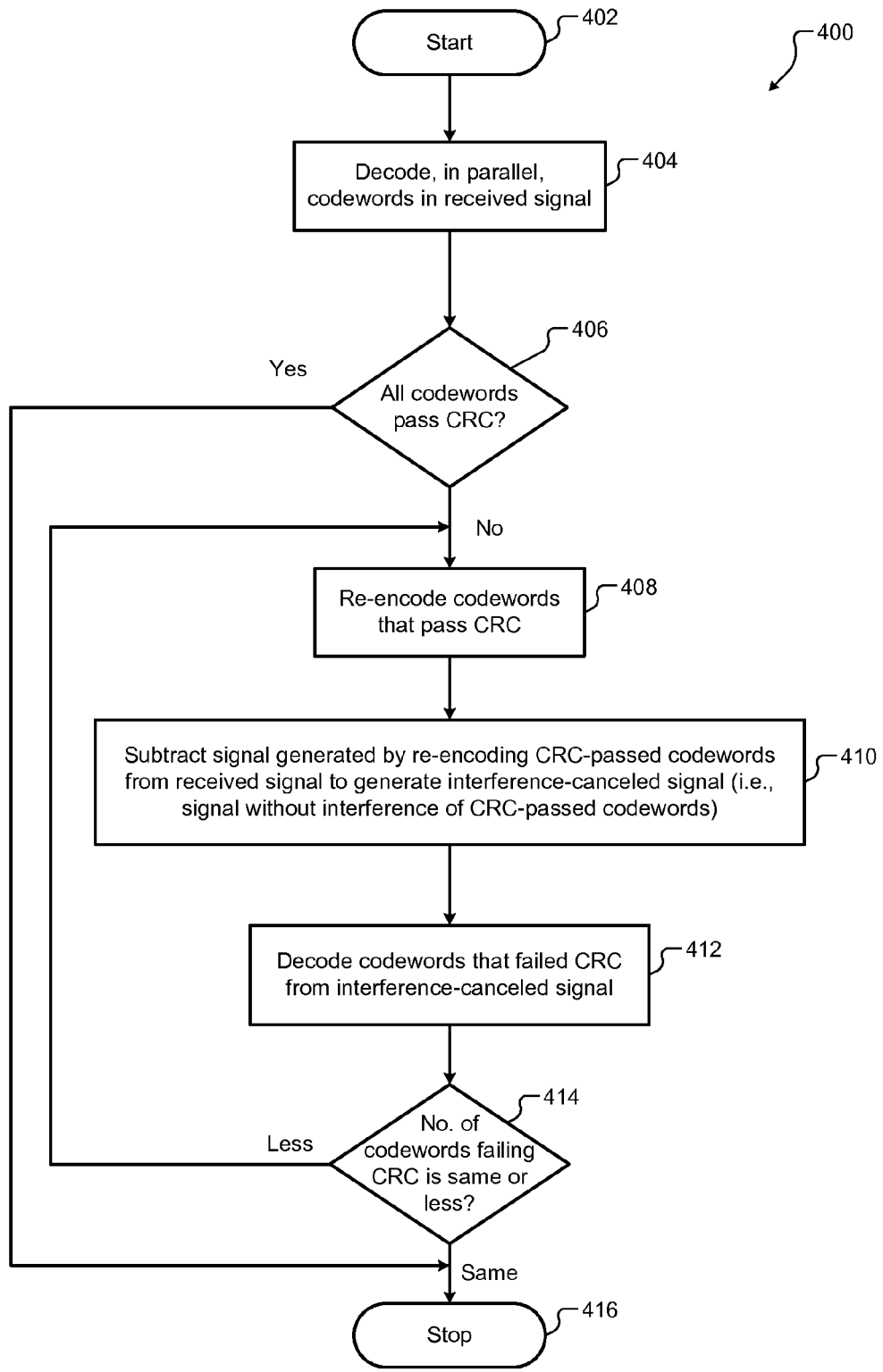
FIGS. 4A and 4B are flowcharts of methods for a parallel SIC receiver.
Figure 4B:
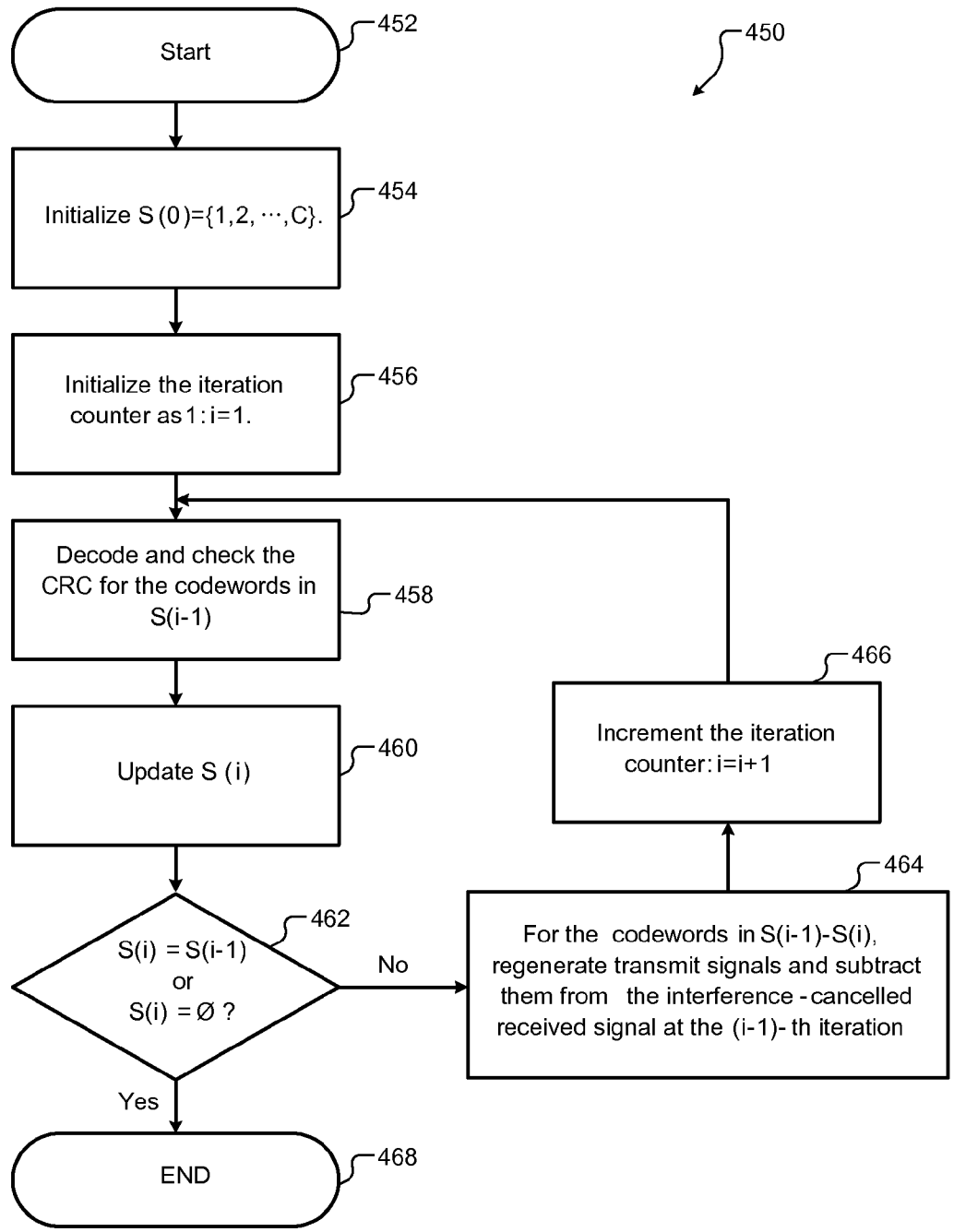
Figure 4C:
FIG. 4C is an example showing decoding of five codewords using a parallel SIC receiver according to the methods shown in FIGS. 4A and 4B.

Referring now to FIGS. 4A-4C, methods 400 and 450 for a parallel SIC receiver are shown. In FIG. 4A, the method 400 is shown. Control begins at 402. At 404, control decodes, in parallel, codewords in the received signal received by the parallel SIC receiver. At 406, control determines if all decoded codewords pass CRC. Control ends at 416 if all decoded codewords passed CRC.

At 408, if one or more but not all of the decoded codewords fails CRC, control re-encodes codewords that pass CRC. At 410, control subtracts a signal generated by re-encoding codewords that passed CRC from the received signal to generate an interference-canceled signal. The interference-canceled signal is a signal without interference of the codewords that passed CRC on the remaining codewords. At 412, control decodes codewords that failed CRC from the interference-canceled signal.

At 414, control determines if the number of codewords failing CRC in the current iteration is the same as or less than the number of codewords failing CRC in the previous iteration. Control returns to 408 if the number of codewords failing CRC in the current iteration is less than the number of codewords that failed CRC in the previous iteration. Control ends at 416 if codewords failing CRC in the current iteration is the same as the number of codewords that failed CRC in the previous iteration.

For example, consider a parallel SIC receiver that receives four codewords CW-1 through CW-4 (i.e., C=4) in the received signal and that the parallel SIC receiver decodes the four codewords CW-1 through CW-4 in parallel. Suppose that decoded codewords CW-1 and CW-4 pass CRC and that decoded codewords CW-2 and CW-3 fail CRC. Decoded codewords CW-1 and CW-4 that passed CRC are re-encoded, transmit signals using the re-encoded codewords CW-1 and CW-4 are regenerated, and the regenerated transmit signals are subtracted from the received signal to cancel interference of codewords CW-1 and CW-4 on codewords CW-2 and CW-3. Let the result of the subtraction be called a first interference-cancelled received signal.

Thereafter, the codewords CW2 and CW-3 that failed CRC are decoded from the first interference-cancelled received signal. Suppose that decoded codeword CW2 passes CRC because interference of codewords CW-1 and CW-4 was cancelled from the received signal. Suppose that the decoded codeword CW-3 failed CRC despite cancelling interference of codewords CW-1 and CW-4 from the received signal.

Next, the decoded codeword CW-2 that passed CRC is re-encoded, transmit signals using the re-encoded codeword CW-2 are regenerated, and the regenerated transmit signals are subtracted from the first interference-cancelled received signal to cancel the interference of the codeword CW-2 on codeword CW-3. Let the result of the subtraction be called a second interference-cancelled received signal.

Thereafter, the codeword CW-3 that failed CRC is decoded from the second interference-cancelled received signal. Decoded codeword CW-3 may pass CRC because interference of codewords CW-1, CW-2, and CW-4 was cancelled from the received signal. Decoding is complete and stopped if the decoded codeword CW-3 passes CRC since all of the four decoded codewords CW-1 through CW-4 have passed CRC.

Alternatively, the decoded codeword CW-3 may fail CRC despite cancelling interference of codewords CW-1, CW-2, and CW-4 from the received signal. Decoding is stopped if the decoded codeword CW-3 fails CRC since all codewords other than codeword CW-3 have passed CRC (i.e., are decoded successfully). In either case (i.e., whether codeword CW-3 passes or fails CRC), decoding is stopped since codewords failing CRC in the current iteration (i.e., codeword CW-3) is the same codeword that failed CRC in the previous iteration (where codeword CW-2 passed CRC but codeword CWC-3 failed CRC).

In FIG. 4B, the method 450 is shown. The method 450 is essentially the same as the method 400 but is shown using more general terms than the method 400. Control begins at 452. At 454, control initializes a set of codewords $S(0)=\{1, 2, \ldots, \text{and } C\}$. In general, $S(i)$ denotes a set of codewords that have not yet passed CRC after an $i^{th}$ iteration. At 456, control initializes an iteration count i=1. At 458, control decodes codewords in a set $S(i-1)$ and checks CRC of decoded codewords in the set $S(i-1)$. At 460, control updates set $S(i)$ by deleting codewords that passed CRC from the set $S(i-1)$.

At 462, control determines if $S(i)=S(i-1)$ (i.e., if the same codewords fail CRC in the $i^{th}$ iteration as in $(i-1)^{th}$ iteration) or if $S(i)$ is a null set (i.e., if all codewords passed CRC). At 464, if $S(i)$ is not the same as $S(i-1)$ or if $S(i)$ is not a null set, control re-encodes codewords in set $S(i-1)-S(i)$, regenerates transmit signals using the codewords in set $S(i-1)-S(i)$, and subtracts the regenerated transmit signals from the interference-cancelled received signal from the $(i-1)^{th}$ iteration. At 466, control increments the iteration count and returns to 458. Control ends at 468 if $S(i)$ is the same as $S(i-1)$ or if $S(i)$ is a null set.

FIG. 4C shows an example using five codewords (i.e., C=5), where four codewords pass CRC while one codeword eventually fails CRC. The example shown (and other examples) can be followed using the flowchart shown in FIG. 4B, by referring to the example explained above, and by referring to the examples explained below (following the description of FIG. 7). The example shown in FIG. 4C is therefore not explained further.

Figure 5:
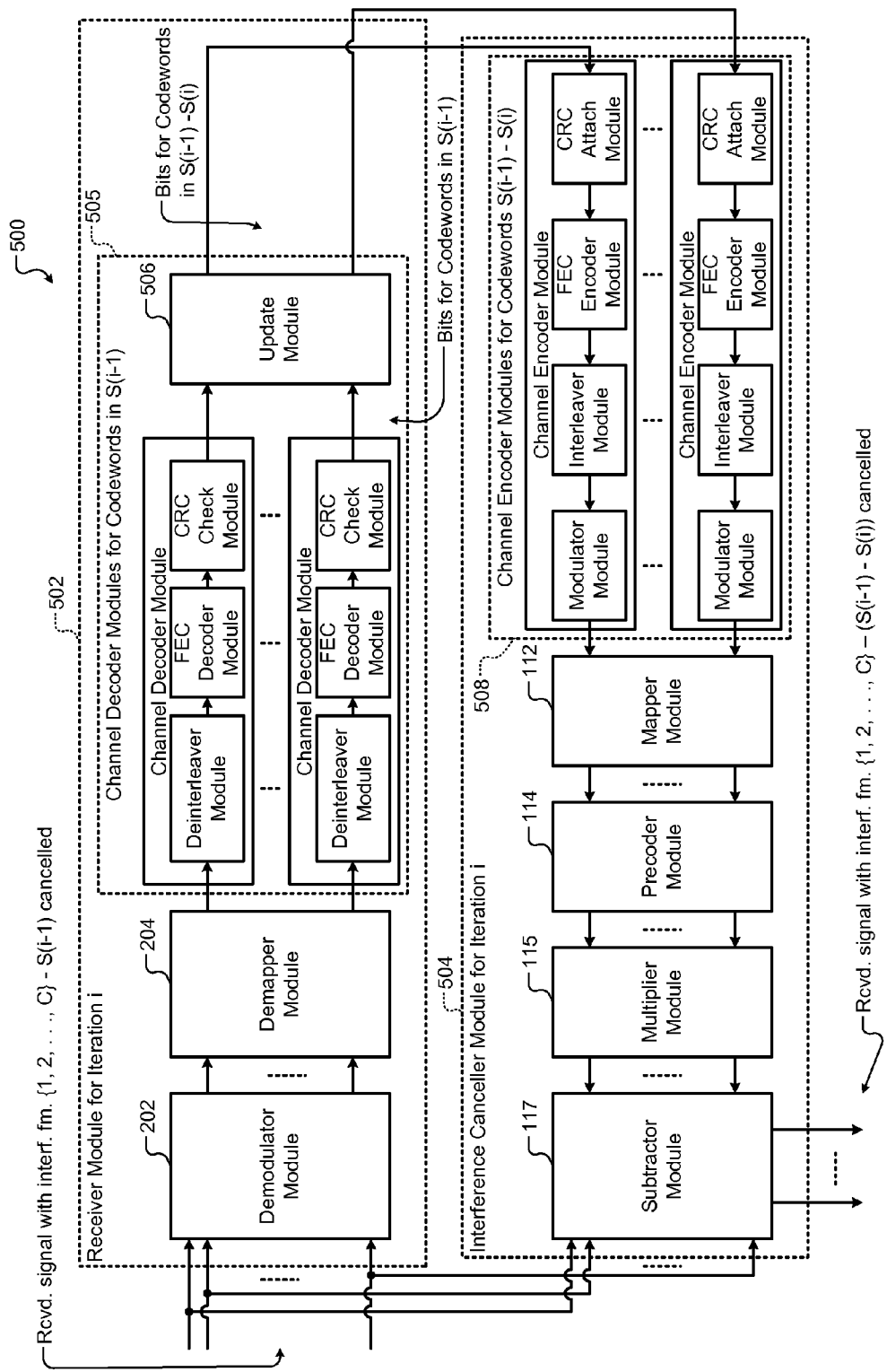
FIG. 5 is a functional block diagram of a parallel SIC receiver.

Referring now to FIG. 5, a portion of a parallel SIC receiver 500 using CRC is shown. While only one receiver module 502 and one interference canceller module 504 of the parallel SIC receiver 500 are shown, the parallel SIC receiver 500 includes a plurality of receiver modules and a plurality of interference canceller modules similar to the receiver module 502 and the interference canceller module 504. The receiver modules and the interference canceller modules of the parallel SIC receiver 500 are arranged in a manner similar to the receiver modules 302 and the interference canceller modules 304 of the receiver 300 shown in FIG. 3A. For convenience, only an $i^{th}$ iteration performed by the parallel SIC receiver 500 using the receiver module 502 and the interference canceller module 504 is shown in FIG. 5.

The receiver module 502 includes the demodulator module 202, the demapper module 204, a plurality of the channel decoder modules 505, which are similar to the channel decoder modules 206 shown in FIG. 2, and an update module 506. The demodulator module 202 operates as described with reference to FIG. 2 except that, in an $i^{th}$ iteration, only the codewords in the set $S(i-1)$ are demodulated. In general, the demodulator module 202 demodulates received signal with interference from codewords (CW-1 through CW-C minus codewords in set $S(i-1)$ (i.e., interference from codewords from iteration $(i-1)$)) cancelled. The demodulator module 202 generates bit LLRs for codewords in set $S(i-1)$.

The demapper module 204 operates as described with reference to FIG. 2. Based on the output of the demapper module 204, the channel decoder modules 505 decode codewords in set S(i−1) and output information bits of the codewords in set S(i−1). The update module 506 deletes codewords that passed CRC from set S(i−1) to generate a set S(i), which includes codewords from set S(i−1) that failed CRC.

The interference canceller module 504 receives the information bits of the decoded codewords in set (S(i−1)-S(i)) (i.e., decoded codewords of set S(i−1) that passed CRC). The interference canceller module 504 includes a plurality of channel encoder modules 508, which are similar to the channel encoder modules 102 shown in FIG. 1, the mapper module 112, the precoder module 114, the multiplier module 115, and the subtractor module 117.

The channel encoder modules re-encode the decoded codewords in the set (S(i−1)-S(i)) (i.e., decoded codewords of set S(i−1) that passed CRC). Additionally, depending on the CRC information generated by the CRC check modules of the channel decoder modules 505, the receiver 500 sends an acknowledgement to the transmitter indicating which codewords are received correctly and transmits a retransmission request to the transmitter to retransmit the codewords that failed CRC.

The mapper module 112, the precoder module 114, the multiplier module 115, and the subtractor module 117 operate as described with reference to FIG. 3B. The subtractor module 117 receives the inputs received by the demodulator module 202, subtracts the output of the multiplier module 115 from the inputs, and outputs received signals without interference from codewords (CW-1 through CW-C minus codewords from the set (S(i−1)-S(i))). That is, the subtractor module 117 outputs signals with interference from codewords (CW-1 through CW-C minus codewords from the set (S(i−1)-S(i))) cancelled from the received signals received by the receiver module 502.

Figure 6A:
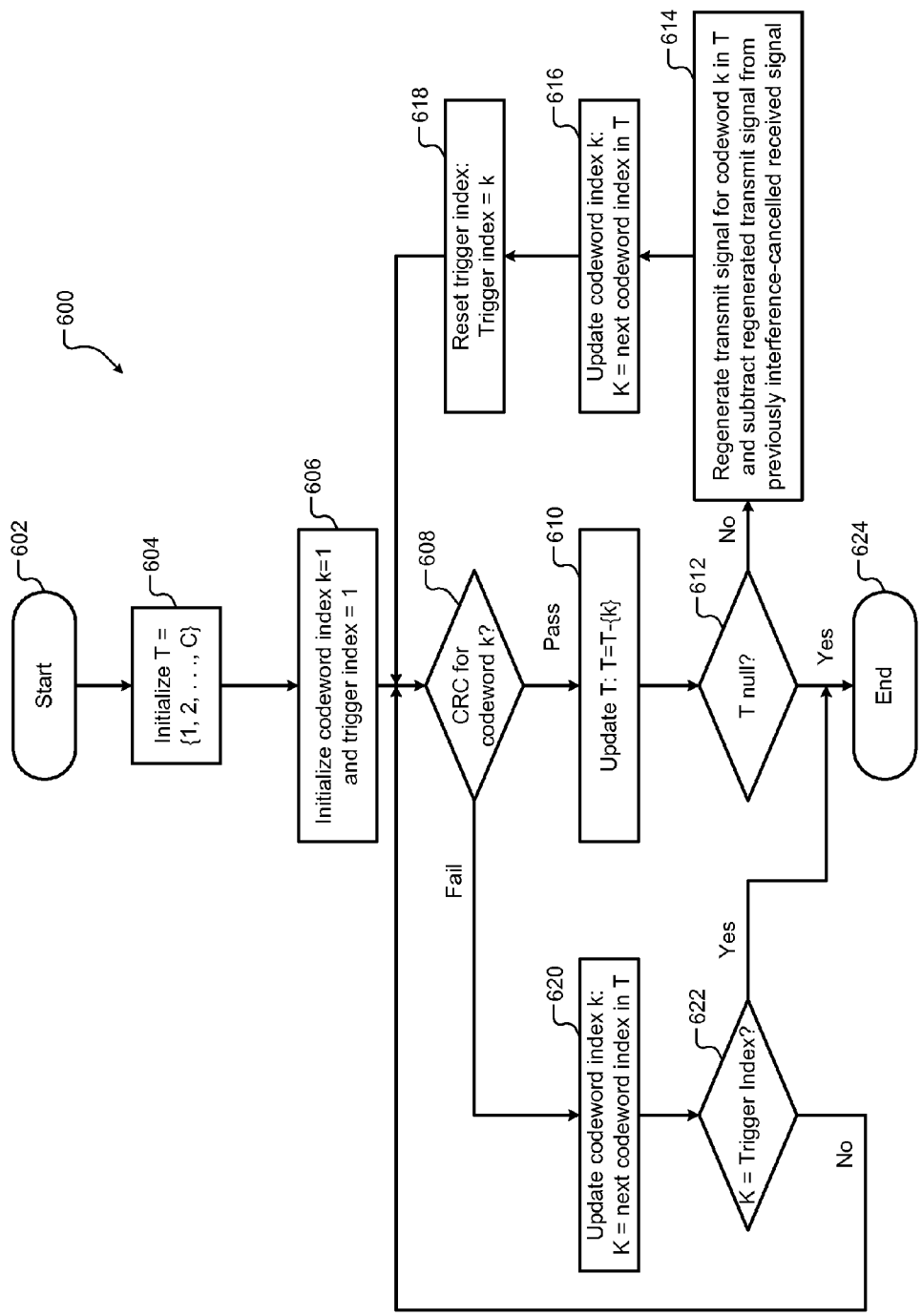
FIG. 6A is a flowchart of a method for a serial SIC receiver.

Referring now to FIGS. 6A and 6B, a method 600 for a serial SIC receiver is shown. Unlike in the parallel SIC receiver, in a serial SIC receiver, codewords are processed sequentially and therefore in an order (i.e., a sequence). An order of codewords can be determined based on factors including, but not limited to, channel gain of the codewords. Processing of codewords can begin with processing of the highest ordered codeword, where the highest ordered codeword is a codeword with the highest channel gain, for example. In the following discussion, codewords are assumed to be pre-arranged in an order, and only processing of the codewords subsequent to ordering is described. In some implementations, the codewords may not be ordered, and a codeword may be randomly selected for decoding.

In FIG. 6A, control begins at 602. At 604, control initializes an ordered set of codewords T={1, 2, . . . , and C} including codewords that have not yet passed CRC. At 606, control initializes a codeword index k as k=1 and a trigger index equal to 1. The codeword index k is an index of next element (codeword) in the ordered set T and is incremented sequentially after decoding each codeword regardless of whether the decoded codeword passes or fails CRC. The trigger index is a codeword index of a codeword in the set T to be decoded next. The trigger index is updated each time a decoded codeword passes CRC and is updated to the codeword index of the codeword to be decoded next.

At 608, control decodes codeword k and checks CRC of decoded codeword k in the set T. At 610, if the decoded codeword k passes CRC, control updates the set T by deleting from the set T the codeword k that passed CRC (i.e., T=T−{k}). At 612, control determines if the set T is a null set (i.e., if all codewords in the set T passed CRC). At 614, if all codewords in the set T have not yet passed CRC, control regenerates transmit signals for the decoded codeword k in the set T that passed CRC, and subtracts the regenerated transmit signals from previously interference-cancelled received signal. At 616, control updates the codeword index k to a codeword index of the next codeword to be decoded in the set T. At 618, control resets the trigger index as trigger index=k (i.e., codeword index of the next to be decoded in the set T), and control returns to 608.

At 620, if the decoded codeword k fails CRC, control updates the codeword index k to a codeword index of the next codeword to be decoded in the set T. Control does not perform transmission signal regeneration and interference cancellation since the decoded codeword k failed CRC. At 622, control determines if the codeword index k is equal to the trigger index. At 624, control stops decoding if the codeword index k is equal to the trigger index. That is, control stops decoding if none of the previously failed codewords passed CRC. Control returns to 608 if the codeword index k is not equal to the trigger index. Thus, transmission signal regeneration and interference cancellation are performed only for codewords that pass CRC.

For example, consider a serial SIC receiver that receives four codewords CW-1 through CW-4 (i.e., C=4) in the received signal and that the serial SIC receiver decodes the four codewords CW-1 through CW-4 serially. Assume that the codewords CW1-1 through CW-4 are ordered and that codeword CW-1 is the most reliable codeword and is therefore selected for decoding first. The following discussion for the example also applies when the codewords CW-1 through CW-4 are not ordered and when the codeword CW-1 is randomly selected for decoding first.

Suppose that the decoded codeword CW-1 passes CRC. The decoded codeword CW-1 that passed CRC is re-encoded, transmit signals using the re-encoded codeword CW-1 are regenerated, and the regenerated transmit signals are subtracted from the received signal to cancel the interference of codeword CW-1 on the remaining codewords CW-2 through CW-4. Let the result of the subtraction be called a first interference-cancelled received signal.

Thereafter, codeword CW-2 is decoded from the first interference-cancelled received signal. Suppose that the decoded codeword CW-2 fails CRC. Transmit signal regeneration and interference cancellation are not performed using decoded codeword CW-2 since codeword CW-2 failed CRC. Instead, codeword CW-3 is decoded from the first interference-cancelled received signal.

Suppose that the decoded codeword CW-3 passes CRC. The decoded codeword CW-3 that passed CRC is re-encoded, transmit signals using the re-encoded codeword CW-3 are regenerated, and the regenerated transmit signals are subtracted from the first interference-cancelled received signal to cancel the interference of codeword CW-3 on the remaining codewords (i.e., codeword CW-2 that failed CRC previously and codeword CW-4). Let the result of the subtraction be called a second interference-cancelled received signal.

Thereafter, codeword CW-4 is decoded from the second interference-cancelled received signal. Suppose that the decoded codeword CW-4 fails CRC. Transmit signal regeneration and interference cancellation are not performed using decoded codeword CW-4 since codeword CW-4 failed CRC. Instead, codeword CW-2 is decoded from the second interference-cancelled received signal.

Suppose that the decoded codeword CW-2 passes CRC. Then the decoded codeword CW-2 that passed CRC is re-encoded, transmit signals using the re-encoded codeword CW-2 are regenerated, and the regenerated transmit signals are subtracted from the second interference-cancelled received signal to cancel the interference of codeword CW-2 on the remaining codewords (i.e., codeword CW-4 that failed CRC previously). Let the result of the subtraction be called a third interference-cancelled received signal.

Thereafter, codeword CW-4 is decoded from the third interference-cancelled received signal. The decoding is stopped after decoding the codeword CW-4 if the decoded codeword CW-4 passes CRC since all the codewords have passed CRC. The decoding is also stopped if the decoded codeword CW-4 fails CRC since no additional codeword passed CRC with which to perform interference cancellation and retry decoding the codeword CW-4.

Suppose, however, that when codeword CW-2 is decoded from the second interference-cancelled received signal, the decoded codeword CW-2 fails CRC. The decoding is stopped after decoding the codeword CW-2. Decoding of the codeword CW-4, which failed CRC previously, is not attempted again since no additional codeword passed CRC (e.g., codeword CW-2 failed) with which to perform interference cancellation and retry decoding the codeword CW-4.

FIG. 6B shows an example of serial SIC receiver using five codewords (i.e., C=5), where four codewords pass CRC while one codeword eventually fails CRC. The example shown (and other examples) can be followed using the flowchart shown in FIG. 6A, by referring to the example explained above, and by referring to the examples explained below (following the description of FIG. 7). The example shown in FIG. 6B is therefore not explained further. An asterisk (*) indicates that codeword CW-4 with y-$H_2x_2$ has to pass CRC since the codeword CW-4 can pass CRC even with y, as can be seen in the parallel SIC receiver (assuming perfect channel estimation).

Figure 7:
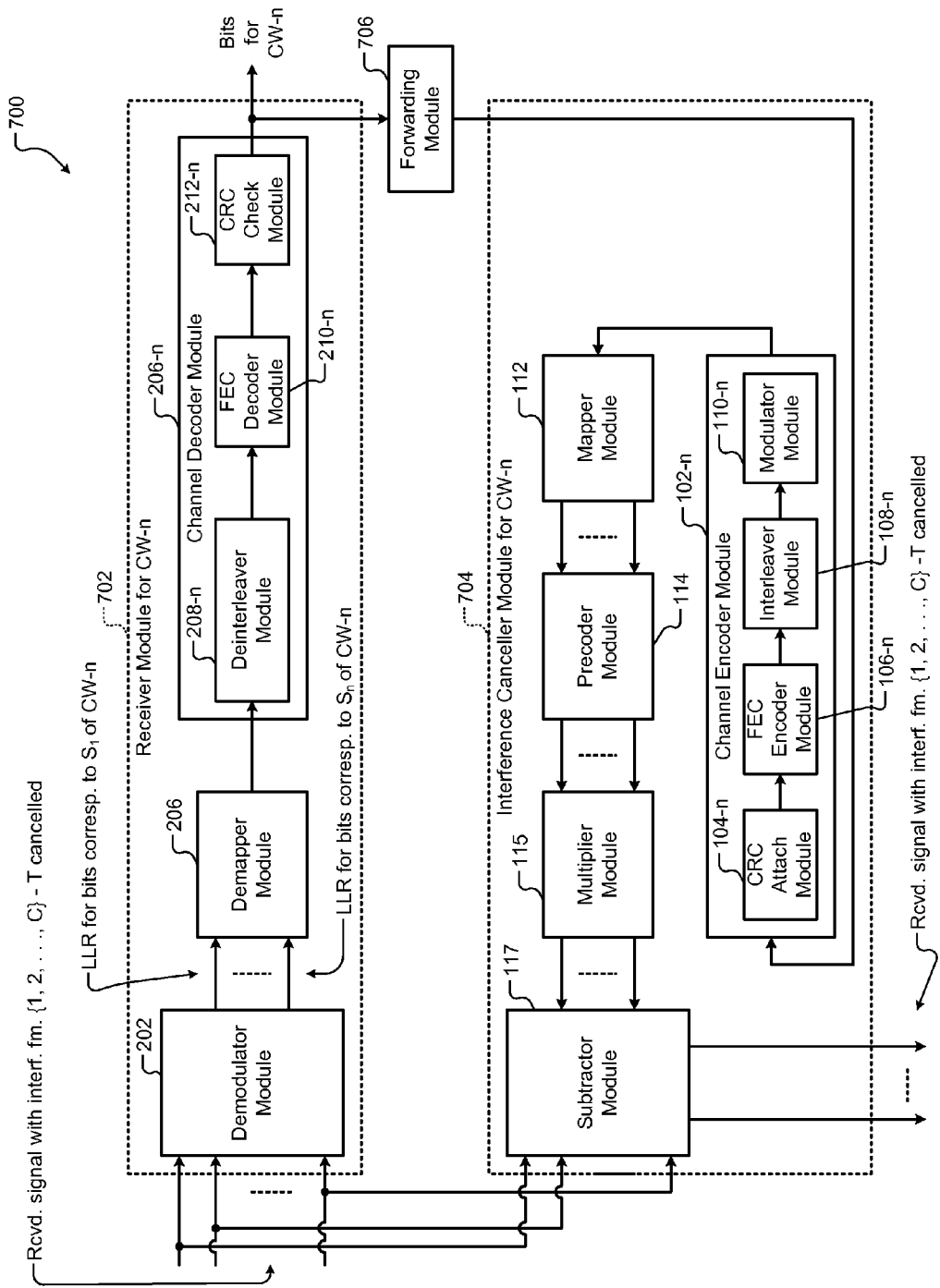
FIG. 7 is a functional block diagram of a serial SIC receiver.

Referring now to FIG. 7, a portion of a serial SIC receiver 700 using CRC is shown. While only one receiver module 702 and one interference canceller module 704 of the serial SIC receiver 700 are shown, the serial SIC receiver 700 includes a plurality of receiver modules and a plurality of interference canceller modules similar to the receiver module 702 and the interference canceller module 704. The receiver modules and the interference canceller modules of the serial SIC receiver 700 are arranged in a manner similar to the receiver modules 302 and the interference canceller modules 304 of the receiver 300 shown in FIG. 3A.

The receiver module 702 includes the demodulator module 202, the demapper module 204, and a channel decoder module 206-$n$, which is similar to the channel decoder modules 206 shown in FIG. 2. The channel decoder module 206-$n$ includes a deinterleaver module 208-$n$, a FEC decoder module 210-$n$, and a CRC check module 212-$n$, which are similar to the deinterleaver modules 208, the FEC decoder modules 210, and the CRC check modules 212, respectively.

The demodulator module 202 operates as described with reference to FIG. 2 except that only one codeword in set T is demodulated at a time. In general, the demodulator module 202 demodulates received signal with interference from codewords (CW-1 through CW-C minus codewords in set T (i.e., codewords that have not yet passed CRC)) cancelled. In other words, the input signal to the demodulator module 202 does not include interference of codewords in set T that passed CRC on remaining codewords. The demodulator module 202 demodulates streams 1 through $S_n$ of the codeword CW-n and generates bit LLRs corresponding to each of the streams 1 through $S_n$ of the codeword CW-n.

The demapper module 204 operates as described with reference to FIG. 2. Based on the output of the demapper module 204, the channel decoder module 206-$n$ decodes codeword CW-n from inputs received by the demodulator module 202. The channel decoder module 206-$n$ outputs information bits of the codeword CW-n. The CRC check module 212-$n$ of the channel decoder module 206-$n$ determines whether the decoded codeword CW-n passed CRC. A forwarding module 706 forwards codeword CW-n to the interference canceller module 704 if the codeword CW-n passed CRC.

The interference canceller module 704 includes a channel encoder module 102-$n$, which is similar to the channel encoder modules 102 shown in FIG. 1, the mapper module 112, the precoder module 114, the multiplier module 115, and the subtractor module 117. The channel encoder module 102-$n$ includes a CRC attach module 104-$n$, a FEC encoder module 106-$n$, an interleaver module 108-$n$, and a modulator module 110-$n$, which are similar to the CRC attach modules 104, the FEC encoder modules 106, the interleaver modules 108, and the modulator modules 110, respectively.

The channel encoder module 102-$n$ re-encodes the codeword CW-n. Additionally, depending on the CRC information generated by the CRC check module 212-$n$ of the channel decoder module 206-$n$, the receiver 700 sends an acknowledgement to the transmitter indicating that the codeword CW-n is received correctly and transmits a retransmission request to the transmitter to retransmit codeword CW-n if the codeword CW-n failed CRC.

The mapper module 112, the precoder module 114, the multiplier module 115, and the subtractor module 117 operate as described with reference to FIG. 3B. The subtractor module 117 receives the inputs received by the demodulator module 202, subtracts the output of the multiplier module 115 from the inputs, and outputs received signals without interference from the codeword CW-n. That is, the subtractor module 117 outputs signals with interference from codewords (CW-1 through CW-C minus codeword CW-n) cancelled from received signals received by the receiver module 702.

A comparison of the parallel SIC receiver and the serial SIC receiver is now presented. For simplicity, the number of codewords decoded by each decoder is assumed to be two (i.e., C=2). In the parallel SIC decoder, in step 1, demodulation and decoding for two codewords are performed (i.e., 2 decoding operations). In step 2, the CRC for each codeword is checked.

In step 3a, whether both codewords pass CRC or both codewords fail CRC is determined, and the decoding is then stopped. A probability of both codewords passing CRC or both codewords failing CRC is $(0.9^2+0.1^2)=82\%$, where 0.9 is a probability that only one of the two codewords passes CRC, and 0.1 is a probability that only one of the two codewords fails CRC. Alternatively, in step 3b, if only one of the two codewords passes CRC, then the decoded codeword that passes CRC is re-encoded and interference of the codeword that passes CRC on the received signal is canceled. A probability of only one of the two codewords passing CRC is $(0.9\times0.1+0.1\times0.9)=18\%$.

In step 4, demodulation and decoding for the codeword that failed in the previous decoding operation are performed (i.e., 1 decoding operation). Thus, average number of decoding operations per two-codeword transmission received by the parallel SIC receiver is $(2+1\times0.18)=2.18$. The parallel SIC decoder uses two decoders to decode two codewords and performs up to four decoding operations in two time periods.

In the serial SIC decoder, the two codewords are assumed to be ordered. In step 1, demodulation and decoding for the first codeword are performed (i.e., 1 decoding operation). In step 2, CRC for the first codeword is checked. In step 3a, if the first codeword passes CRC, then the transmit signal regeneration and interference cancellation are performed for the first codeword, followed by decoding of the second codeword (i.e., 1 decoding operation). The probability that the first codeword passes CRC is 90%. The probability is 90% when the two codewords are not ordered and when the first codeword is selected randomly. The probability can increase if the codewords are ordered and if the first codeword is selected based on the ordering as the more reliable of the two codewords.

In step 3b, if the first codeword fails, the second codeword is decoded, and CRC is performed for the second codeword (i.e., 1 decoding operation). The probability that the first codeword fails CRC is 10%. Again, the probability is a function of ordering of the codewords. In step 3b-1, if the second codeword passes CRC, then the transmit signal regeneration and interference cancellation are performed for the second codeword, and then the first codeword is decoded (i.e., 1 decoding operation). The probability that the second codeword passes CRC is 9%. In step 3b-2, if the second codeword also fails CRC, then decoding ends. The probability that the second codeword also fails CRC is 1%. Thus, the average number of decoding operations per two-codeword transmission received by the serial SIC receiver is (2+1×0.09)=2.09. The average number of decoding operations can be further reduced if codeword ordering is employed before step 1. Ordering codewords, however, increases complexity of the serial SIC receiver.

The serial SIC receiver uses only one decoder to decode two codewords while the parallel SIC receiver uses two decoders to decode two codewords. The serial SIC receiver decodes two codewords by performing up to three decoding operations serially while the parallel SIC receiver decodes two codewords by performing up to four decoding operations using two decoders in parallel. Thus, the serial SIC receiver may perform less number of decoding operations than the parallel SIC receiver, and the number of decoding operations in the serial SIC receiver may depend on the ordering of the codewords. Further, the serial SIC receiver performs the three decoding operations in three time units while the parallel SIC receiver performs the four decoding operations in two time units. Accordingly, the serial SIC receiver has a greater latency than the parallel SIC receiver, and the latency of the serial SIC receiver is proportional to the number of codewords decoded serially.

CRC-based feedback can help prevent the error propagation in SIC receivers in some implementations. Several adaptive SIC receivers are described below, which improve interference cancellation gain by alleviating error propagation. The following discussion uses a serial SIC receiver (e.g., the receiver shown in FIG. 3B) for example only. The discussion applies equally to a parallel SIC receiver (e.g., the receiver shown in FIG. 5).

The SIC process used by a serial SIC receiver is summarized below. The codewords to be decoded (e.g., 1, 2, . . . , C) are ordered as follows.

$$\{1, 2, \ldots C\} \rightarrow \Pi = (L_1, L_2, \ldots L_C)$$

The received signal for the first codeword to be decoded is the receive signal y. That is, $$\hat{y}_1 = y.$$

An effective channel matrix for a first decoding stage of the receiver (e.g., the receiver module 302-1 and the interference canceller module 304-1 shown in FIG. 3A) is H. That is, $$\hat{H}_1 = H.$$

In general, for i=1 to C, the codeword to be decoded at an $i^{th}$ decoding stage (e.g., a receiver module 302-i and an interference canceller module 304-i) of the receiver is $L_i$. The $i^{th}$ decoding stage demodulates and decodes the codeword $L_i$ based on $\hat{y}_i$ and $\hat{H}_i$. The $i^{th}$ decoding stage regenerates a transmitted signal $\hat{x}_{L_i}$. The $i^{th}$ decoding stage cancels interference from the received signal and generates a received signal for an $(i+1)^{th}$ decoding stage of the receiver. The received signal for the $(i+1)^{th}$ decoding stage is given by the following equation.

$$\hat{y}_{i+1} = \hat{y}_i - H_{L_i} \hat{x}_i$$

In general, the feedback and the effective channel matrix for the $i^{th}$ decoding stage can be expressed as follows.

$$\hat{x}_i = f(\tilde{x}_{L_i})$$

$$\hat{H}_{i+1} = g(\hat{H}_i, H_{L_i})$$

For a non-adaptive SIC receiver, $$\hat{x}_i = \tilde{x}_{L_i}, \text{ and } \hat{H}_{i+1} = \hat{H}_i \backslash H_{L_i}$$

where $\hat{H}_i \backslash H_{L_i}$ denotes deletion of columns of matrix $H_{L_i}$ from matrix $\hat{H}_i$.

In CRC-based non-adaptive SIC receivers, feedback can be turned on or off based on the CRC check of the decoded codeword (e.g., see FIG. 7 and corresponding description). The SIC process is continued if the decoded codeword passes CRC check, and the SIC process is terminated if the decoded codeword fails the CRC check. The general adaptive SIC in such an implementation operates as a hard or binary SIC process that can be mathematically expressed as follows.

$$\hat{x}_i = f(\tilde{x}_i) = \begin{cases} \tilde{x}_{L_i} & CRC \text{ check passed} \\ 0 & CRC \text{ check failed} \end{cases}$$

$$\hat{H}_{i+1} = g(\hat{H}_i, H_{L_i}) = \begin{cases} \hat{H}_i \backslash H_{L_i} & CRC \text{ check passed} \\ \hat{H}_i & CRC \text{ check failed} \end{cases}$$

The hard or binary SIC process prevents error propagation at a loss of some interference cancellation gain. If a decoded codeword fails CRC check because the decoded codeword includes only a few erroneous bits, the feedback generated based on the erroneous decoded codeword can still improve the probability of successfully decoding a following codeword. Therefore, feedback generated based on the (slightly) erroneous decoded codeword can be used for interference cancellation, and the SIC process using the feedback can be continued instead of being terminated simply because the decoded codeword failed the CRC check. In implementations where CRC-check modules (212-1, 212-2, . . . , 212-C shown in FIG. 2) are not used, other forms of adaptive SIC can be used to exploit interference cancellation gain and prevent the error propagation at the same time.

Accordingly, instead of using the feedback only if the decoded codeword passes the CRC check, adaptive SIC receivers can use the feedback based on reliability of the feedback. (CRC check can also be used as one kind of reliability measurement.) Adaptive SIC receivers can also adjust (i.e., scale) the feedback according to the reliability of the feedback. Adaptive SIC receivers in which the feedback can be turned on or off by comparing the reliability of the feedback to a predetermined threshold may be called threshold-based adaptive SIC receivers. The threshold can be determined per codeword and/or per decoding stage of the receiver. Adaptive SIC receivers in which the feedback can be scaled according to the reliability of the feedback may be called scaled-feedback-based adaptive SIC receivers. Each type of adaptive SIC receiver is discussed below in turn.

In threshold-based adaptive SIC receivers, feedback for interference cancellation can be turned on if a predetermined criterion is met and turned off otherwise (i.e., decoding is continued using non-SIC methods such as MMSE/ZF/ML). Mathematically, the feedback and the effective channel matrix for an $i^{th}$ decoding stage of a threshold-based adaptive SIC receiver are determined using the following equation.

$$\hat{x}_i = \begin{cases} \tilde{x}_{L_i} & J^{(L_i)} \geq J^{(i)}_{threshold} \\ 0 & J^{(L_i)} < J^{(i)}_{threshold} \end{cases}$$

$$\hat{H}_{i+1} = \begin{cases} \hat{H}_i \setminus H_{L_i} & J^{(L_i)} \geq J^{(i)}_{threshold} \\ \hat{H}_i & J^{(L_i)} < J^{(i)}_{threshold} \end{cases}$$

where J is a reliability metric for codeword $L_i$ that is measured and compared to a predetermined threshold to enable or disable the feedback.

The reliability metric can be a function of CRC, packet error rate (PER), bit error rate (BER), signal-to noise ratio (SNR), and so on. Depending on the criterion used, a corresponding threshold for the reliability metric can be predetermined offline or can be set as a programmable value. The predetermined threshold can be set per codeword and/or decoding stage of the receiver. For example, the predetermined threshold can be set based on a quality-of-service (QoS) requirement of each codeword. The predetermined threshold can also be set based on parameters including latency (delay), modulation, and coding rate of each decoding stage. Other considerations in determining the threshold can include automatic repeat request (ARQ) or hybrid ARQ (HARQ) based error-control used by each decoding stage. Many other parameters may be used to determine the threshold for each decoding stage.

The feedback generated based on a decoded codeword can be used for interference cancellation if an error in the feedback is below a predetermined threshold (i.e., if the reliability metric of the feedback is greater than or equal to a predetermined threshold). The feedback is said to be reliable when the error in the feedback is below the predetermined threshold (i.e., when the reliability metric of the feedback is greater than or equal to the predetermined threshold). Many different criteria may be used to measure the reliability metric of the feedback. Non-limiting examples of the criteria include packet error rate (PER) and signal-to-noise ratio (SNR).

For example, the reliability metric of the feedback can be measured in terms of PER. When the reliability metric of the feedback is measured in terms of PER, the feedback and the effective channel matrix at an $i^{th}$ decoding stage of an adaptive SIC receiver are determined using the following equation.

$$\hat{x}_i = \begin{cases} \tilde{x}_{L_i} & P_e^{(L_i)} \leq P^{(i)}_{threshold} \\ 0 & P_e^{(L_i)} > P^{(i)}_{threshold} \end{cases}$$

$$\hat{H}_{i+1} = \begin{cases} \hat{H}_i \setminus H_{L_i} & P_e^{(L_i)} \leq P^{(i)}_{threshold} \\ \hat{H}_i & P_e^{(L_i)} > P^{(i)}_{threshold} \end{cases}$$

where $P_e^{(L_i)}$ is the packet error rate (PER) of the codeword $L_1$.

The PER can be estimated using various of approaches such as Mean Mutual Information per Bit (MMIB), Finite Alphabet Capacity (FAC), and Exponential Effective SNR Mapping (EESM).

Alternatively, the reliability metric of the feedback can be measured in terms of SNR. when the reliability metric of the feedback is measured in terms of SNR, the feedback and the effective channel matrix at an $i^{th}$ decoding stage of an adaptive SIC receiver are determined using the following equation.

$$\hat{x}_i = \begin{cases} \tilde{x}_{L_i} & SNR_{L_i} \geq SNR^{(i)}_{threshold} \\ 0 & SNR_{L_i} < SNR^{(i)}_{threshold} \end{cases}$$

$$\hat{H}_{i+1} = \begin{cases} \hat{H}_i \setminus H_{L_i} & SNR_{L_i} \geq SNR^{(i)}_{threshold} \\ \hat{H}_i & SNR_{L_i} < SNR^{(i)}_{threshold} \end{cases}$$

The SNR of the codeword $L_i$ can be measured in different ways. For example, the SNR may include transmit SNR (i.e., pre-processing SNR at the receiver), received SNR/SINR (i.e., post-processing SNR at the receiver), etc. The SNR can also be averaged across time/frequency as follows.

$$SNR_{L_i} = \frac{1}{M} \sum_{m=0}^{M-1} SNR_{L_i}(m)$$

or $$SNR_{L_i} = \exp\left(\frac{1}{M} \sum_{m=0}^{M-1} \log(1 + SNR_{L_i}(m))\right) - 1$$

Alternatively, in scaled-feedback-based adaptive SIC receivers, the feedback can be scaled according to the reliability metric of the feedback. The feedback and the effective channel matrix at an $i^{th}$ decoding stage of an adaptive SIC receiver are determined using the following equation.

$$\hat{x}_i = \alpha^{(i)} \tilde{x}_{L_i}$$

$$\hat{H}_{i+1} = \hat{H}_i \setminus \alpha^{(i)} H_{L_i}$$

where $\alpha$ is a scaling factor based on the reliability metric of the feedback. $\hat{H}_i \setminus \alpha^{(i)} H_{L_i}$ denotes subtraction of columns of matrix $\alpha^{(i)} H_{L_i}$ from the corresponding columns of matrix $\hat{H}_i$.

The scaling factor $\alpha$ can be determined as follows. For example, if the reliability metric of the feedback is determined based on PER or SNR, the scaling factor $\alpha$ can be determined using the following equations.

$$\alpha^{(i)} = 1 - P_e^{(L_i)} \text{ PER-based}$$

$$\alpha^{(i)} = \min\left(1, \frac{SNR_{L_i}}{SNR^{(i)}_{max}}\right)$$

In other words, the scaling factor $\alpha$ can have a value between 0 and 1. The value of the scaling factor $\alpha$ can indicate the reliability of the feedback. For example, the reliability of the feedback is highest if $\alpha=1$. Conversely, the reliability of the feedback is lowest if $\alpha=0$. If the value of $\alpha$ can only be 0 or 1, the scaled-feedback-based adaptive SIC receiver operates as a threshold-based adaptive SIC receiver, where the feedback is used when $\alpha=1$ and not used when $\alpha=0$.

Figure 8A:
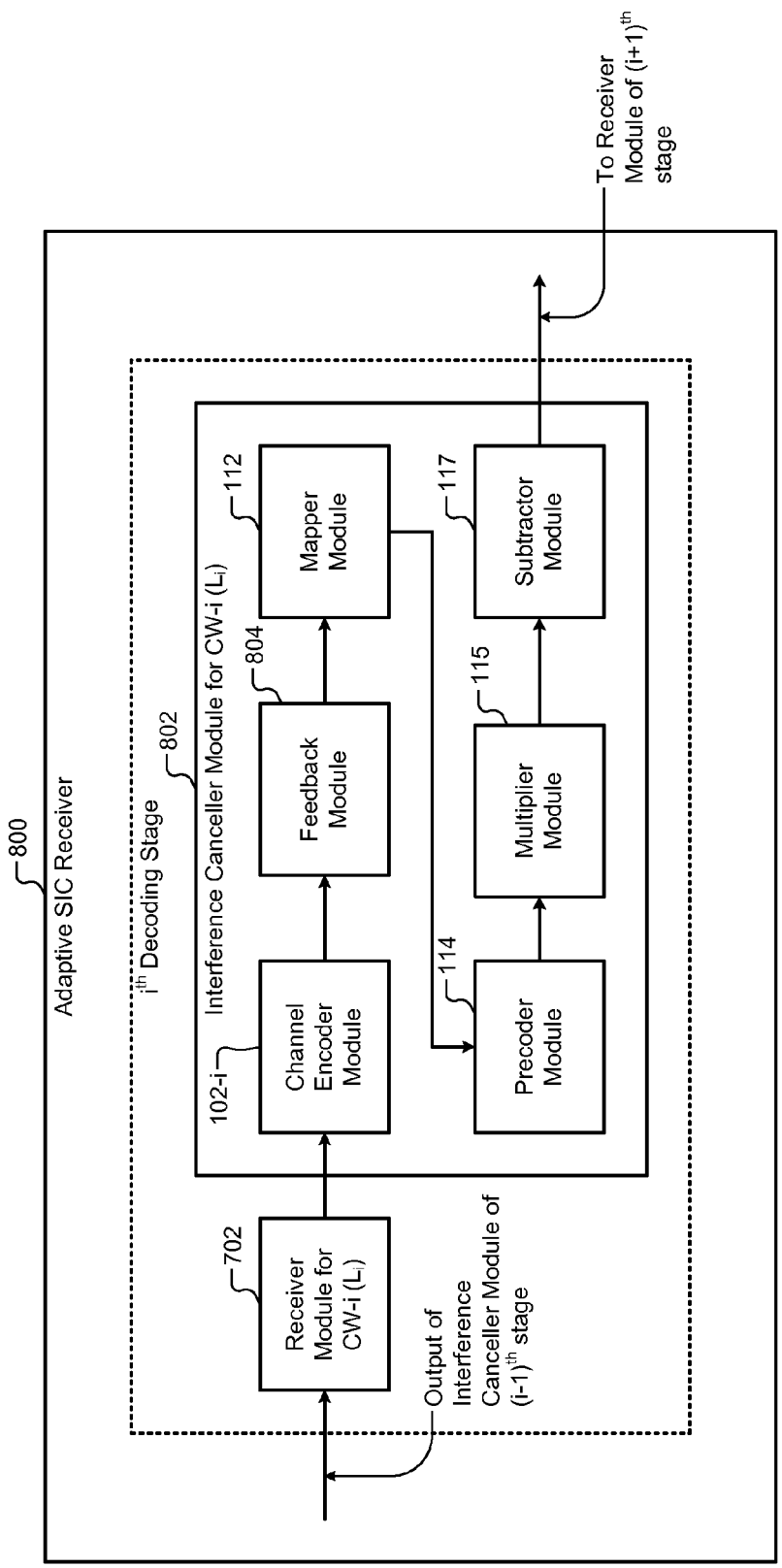
FIG. 8A is a functional block diagram of an adaptive SIC receiver.
Figure 8B:
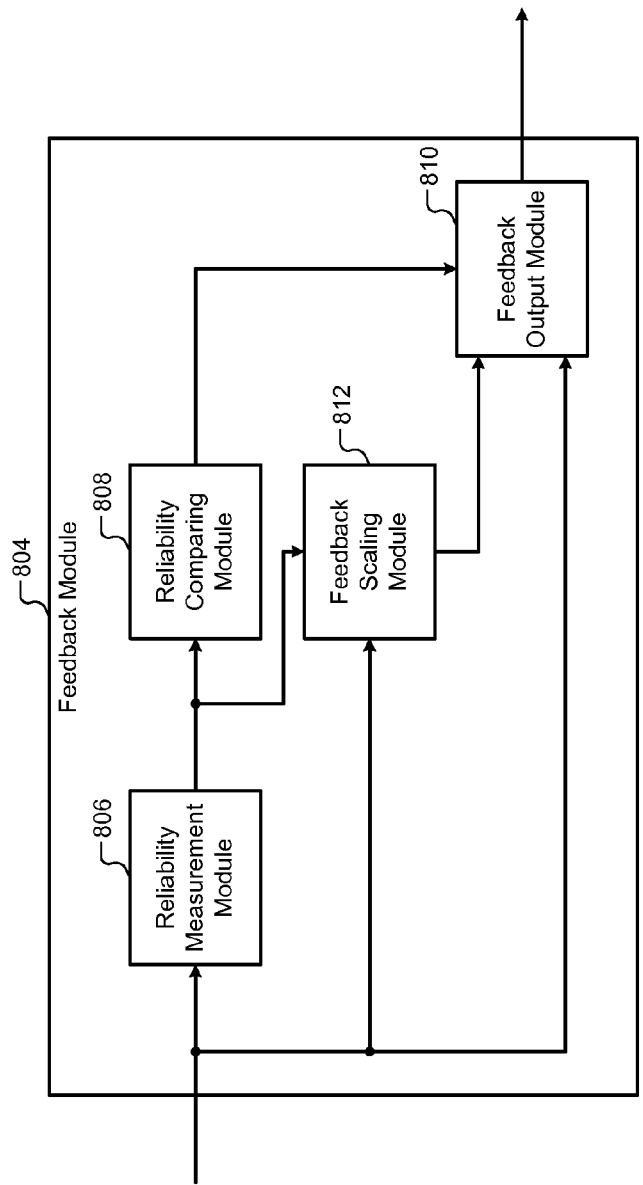
FIG. 8B is a functional block diagram of a feedback module of the adaptive SIC receiver of FIG. 8A.

Referring now to FIGS. 8A and 8B, an $i^{th}$ stage of an adaptive SIC receiver 800 is shown. In FIG. 8A, the adaptive SIC receiver 800 includes the receiver module 702 (shown in FIG. 3B) and an interference canceller module 802. The interference canceller module 804 includes the channel encoder module 102 (shown in FIG. 3B) and a feedback module 804. The interference canceller module 804 additionally includes the mapper module 112, the precoder module 114, the multiplier module 115, and the subtractor module 117 (all shown and described with reference to FIG. 3B).

The receiver module 702 decodes codewords from an output of an interference canceller module of an $(i-1)^{th}$ decoding stage as described with reference to FIG. 3B. The channel encoder module 102 regenerates a transmit signal as described with reference to FIG. 3B. The feedback module 804, which is shown in detail in FIG. 8B, measures a reliability metric of the regenerated transmit signal as discussed above.

When the adaptive SIC receiver 800 operates as a threshold-based adaptive SIC receiver, the feedback module 804 determines whether to use the regenerated transmit signal for interference cancellation based on a predetermined threshold. When the adaptive SIC receiver 800 operates as a threshold-based adaptive SIC receiver, the feedback module 804 scales the regenerated transmit signal according to the reliability metric and uses the scaled regenerated transmit signal for interference cancellation. The subtractor module 117 outputs an interference cancelled signal to an $(i+1)^{th}$ decoding stage of the receiver 800.

In FIG. 8B, the feedback module 804 includes a reliability measurement module 806, a reliability comparing module 808, a feedback scaling module, and a feedback output module 810. The reliability measurement module 806 measures the reliability metric of the regenerated transmit signal as explained above. The reliability comparing module 808 compares the reliability metric to a predetermined threshold and outputs a result to the feedback output module 810. The feedback output module 810 determines based on the result of the comparison whether to output the regenerated transmit signal for use in interference cancellation.

When scaling is used, the feedback scaling module 808 scales the regenerated transmit signal by a scaling factor based on the reliability metric and outputs the scaled regenerated transmit signal to the feedback output module 810. The feedback output module 810 outputs the scaled regenerated transmit signal for use in interference cancellation.

Figures 9A, 9B:
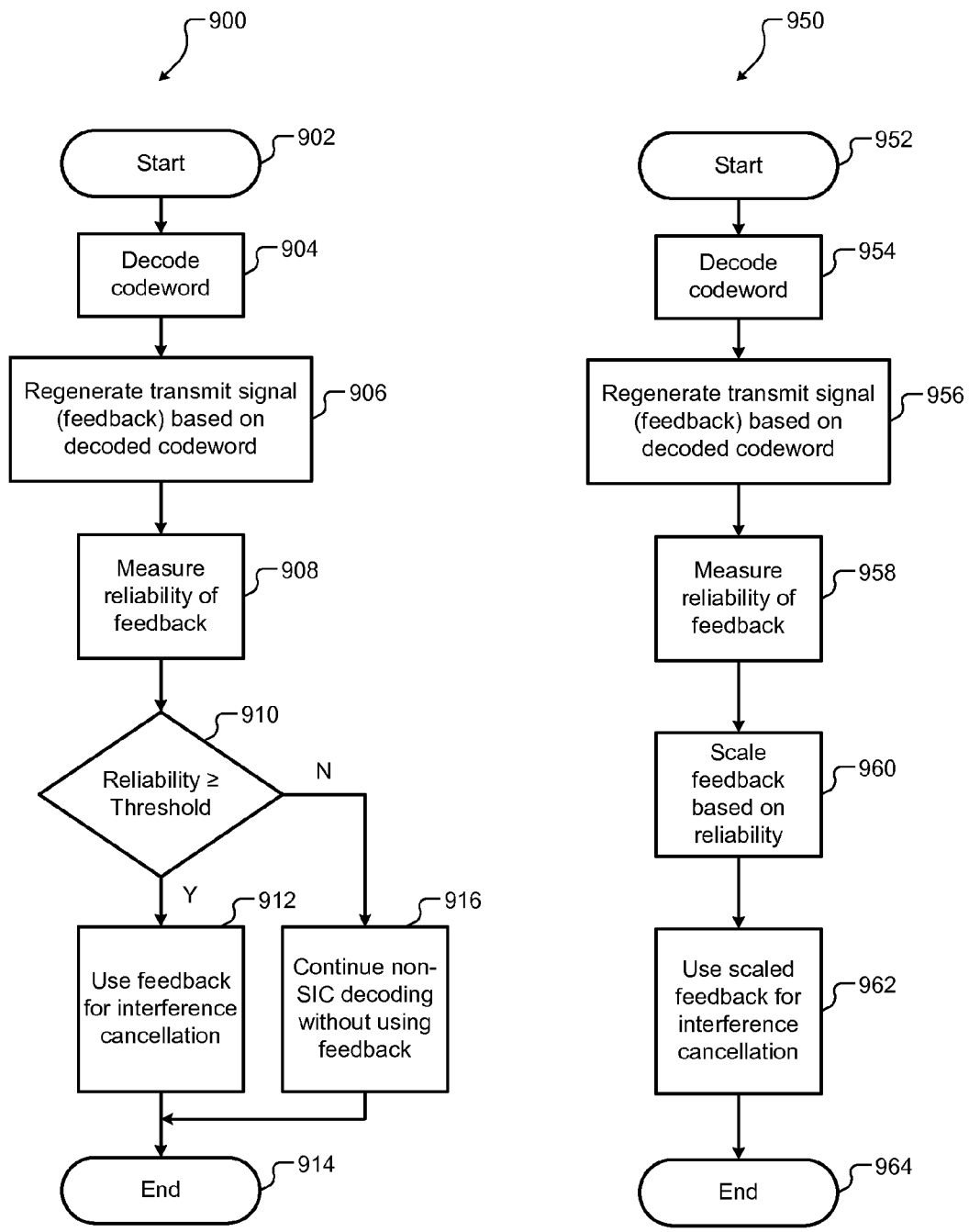
FIG. 9A is a flowchart of a method for a threshold-based adaptive SIC receiver.
FIG. 9B is a flowchart of a method for a scaled-feedback-based adaptive SIC receiver.

Referring now to FIGS. 9A and 9B, methods for adaptive SIC receivers according to the present disclosure are shown. In FIG. 9A, a method 900 for a threshold-based adaptive SIC receiver is shown. In FIG. 9B, a method 950 for a scaled-feedback-based adaptive SIC receiver is shown. Operations performed by only one decoding stage of each type of receiver are shown for simplicity of illustration. The operations are repeated by subsequent decoding stages of the receivers until decoding is complete.

In FIG. 9A, control begins at 902. Control decodes a codeword at 904. Control regenerates a transmit signal (feedback) based on the decoded codeword at 906. Control measures reliability of the feedback at 908. Control determines at 910 if the reliability is greater than or equal to a predetermined threshold. At 912, control uses the feedback for interference cancellation if the reliability is greater than or equal to a predetermined threshold, and control ends at 914. At 916, if the reliability is less than the predetermined threshold, control continues non-SIC decoding without using the feedback, and control ends at 914.

In FIG. 9B, control begins at 952. Control decodes a codeword at 954. Control regenerates a transmit signal (feedback) based on the decoded codeword at 956. Control measures reliability of the feedback at 958. Control scales the feedback based on the reliability at 960. Control uses the scaled feedback for interference cancellation at 962, and control ends at 964.

Figure 10A:
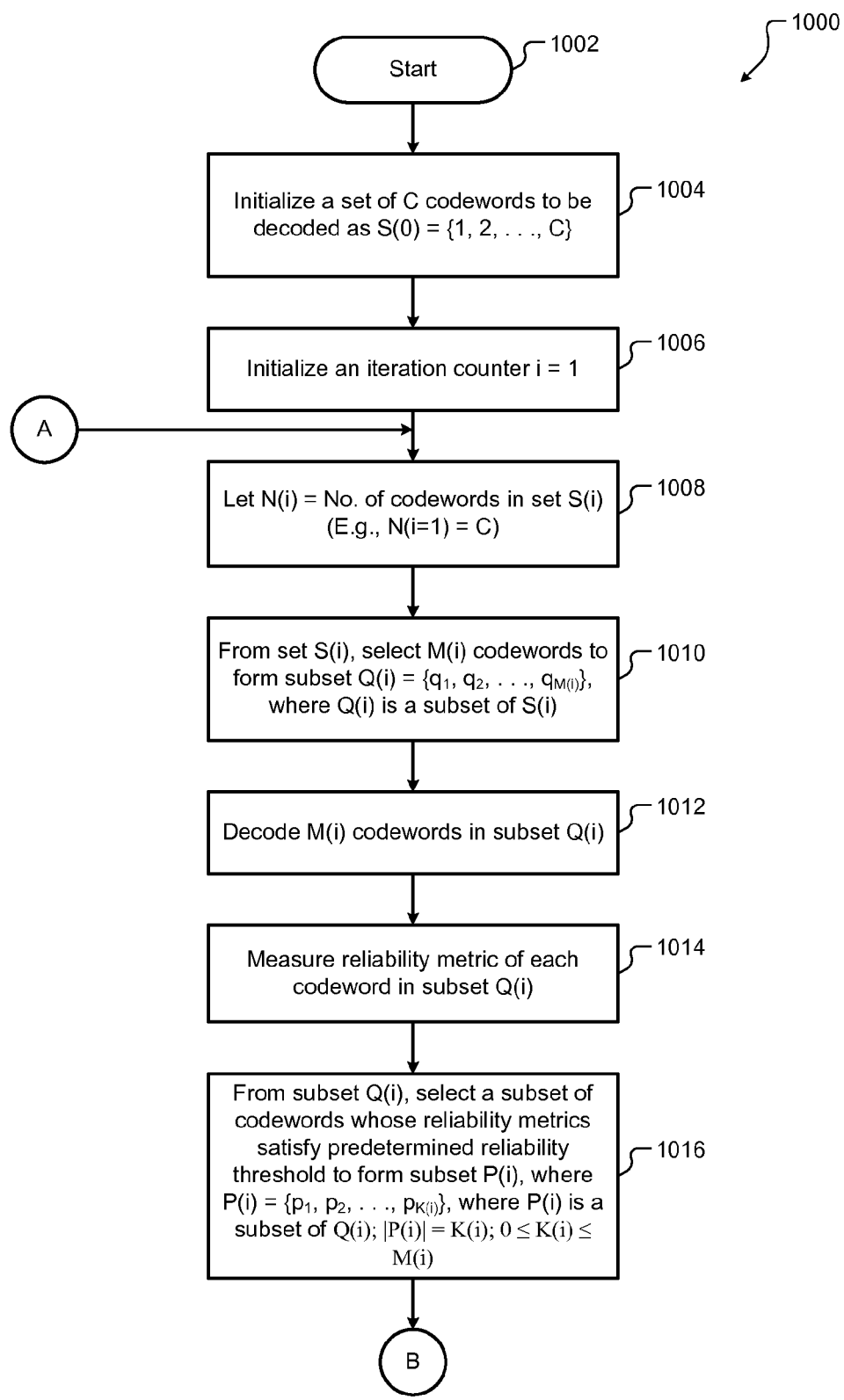
FIGS. 10A and 10B depict a flowchart of a general method for the adaptive SIC receiver shown in FIGS. 8A and 8B.
Figure 10B:
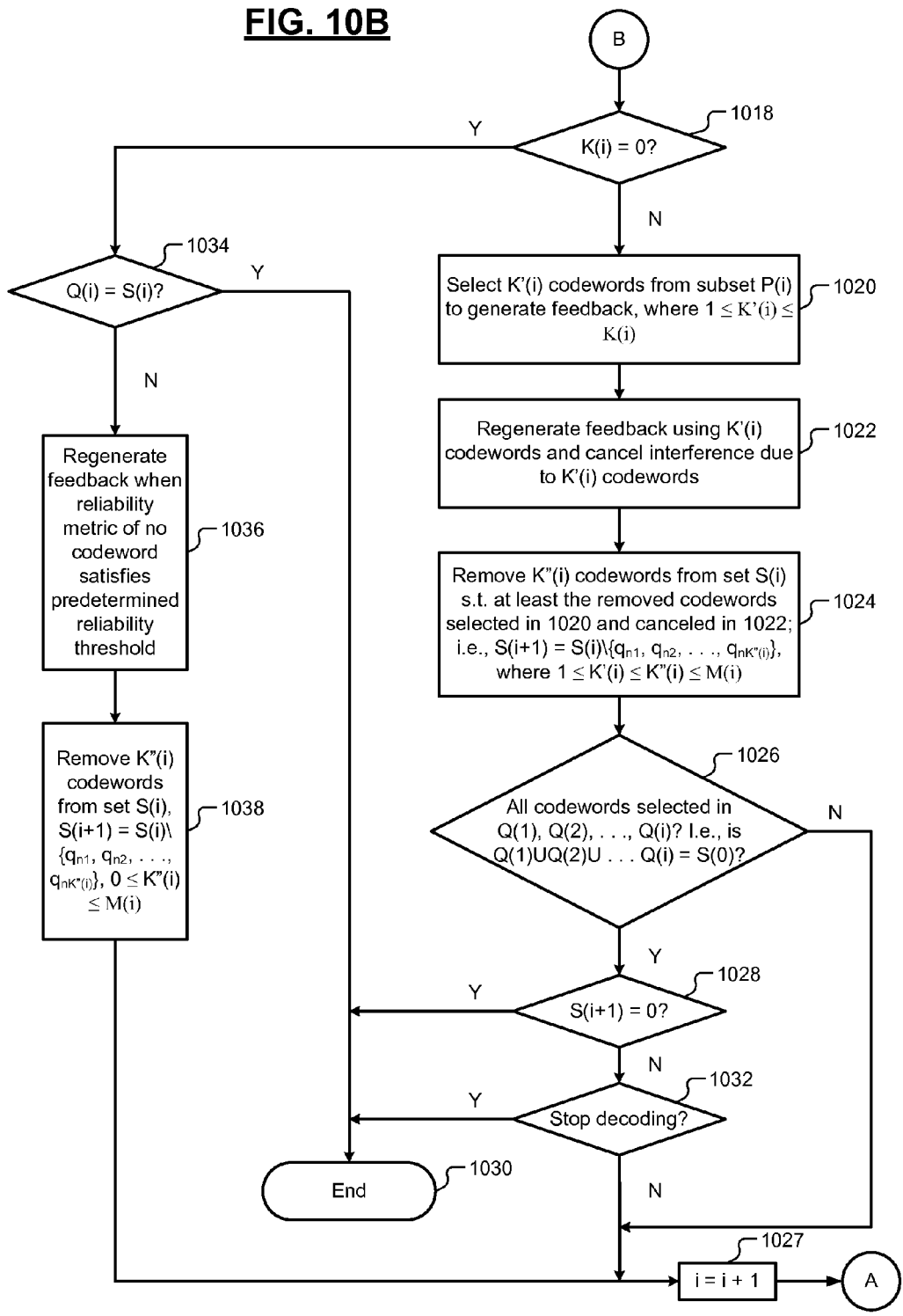

Referring now to FIGS. 10A and 10B, a general method 1000 for an adaptive SIC receiver is shown. The method 1000 can be used by serial as well as parallel adaptive SIC receivers. The serial and parallel adaptive SIC receivers may be threshold-based adaptive SIC receivers or scaled-feedback-based adaptive SIC receivers. The method 100 can be executed by the adaptive SIC receiver shown in FIGS. 8A and 8B.

Control begins at 1002. Suppose that the adaptive SIC receiver implementing the method 1000 receives a signal including a total of C codewords that need to be decoded. For example, an $i^{th}$ stage of the adaptive SIC receiver may receive the signal including a total of C codewords from an $(i-1)^{th}$ stage of the adaptive SIC receiver. At 1004, control initializes a set of C codewords to be decoded as $S(0)=\{1, 2, \ldots, C\}$. At 1006, control initializes an iteration counter i=1. At 1008, control sets N(i)=number of codewords in set S(i). For example, when i=1, N(i)=C.

At 1010, control selects M(i) codewords from the set S(i) and generates a subset Q(i) including the selected codewords M(i). That is, $Q(i)=\{q_1, q_2, \ldots, q_{M(i)}\}$, where $Q(i) \subseteq S(i)$ or Q(i) is a subset of S(i) (i.e., $M(i) \leq N(i)$). At 1012, control decodes the M(i) codewords in the subset Q(i). At 1014, control measures reliability metric of each codeword in the subset Q(i). At 1016, control selects codewords from the subset Q(i) whose reliability metrics satisfy a predetermined reliability threshold and generates a subset $P(i)=\{p_1, p_2, \ldots, p_{K(i)}\}$, where $P(i) \subseteq Q(i)$, |P(i)|=K(i), and $0 \leq K(i) \leq M(i)$. For example only, the predetermined reliability threshold can include a predetermined error rate, a predetermined SNR, or CRC check.

At 1018, control determines if K(i)=0. K(i) is zero if none of the codewords from the subset P(i) satisfies the predetermined reliability threshold, and K(i) is not zero if at least one of the codewords from the subset P(i) satisfies the predetermined reliability threshold. At 1020, if at least one of the codewords from the subset P(i) satisfies the predetermined reliability threshold, control selects K'(i) codewords from the subset P(i) that satisfy the predetermined reliability threshold to generate feedback, where $1 \leq K'(i) \leq K(i)$. At 1022, control regenerates transmit signal (feedback) using K'(i) codewords and cancels interference due to K'(i) codewords from the received signal.

At 1024, control removes (deletes) K"(i) codewords from the set S(i) so that the removed codewords include at least the codewords that belong to the subset P(i). That is, the removed codewords include at least the codewords that have been selected at 1020 and used for interference cancellation at 1022. Accordingly, $S(i+1)=S(i) \backslash \{q_{n1}, q_{n2}, \ldots, q_{nK''(i)}\}$, where $1 \leq K'(i) \leq K''(i) \leq M(i)$.

At 1026, control determines if all the codewords from the set S(0) have been selected in subsets Q(1), Q(2), ..., Q(i). That is, control determines if $Q(1) \cup Q(2) \cup \ldots \cup Q(i) = S(0)$. If all the codewords from the set S(0) have not yet been selected, control increments the iteration counter i=i+1 at 1027, and control returns to 1008. At 1028, if all the codewords from the set S(0) have been selected, control determines if S(i+1)=0. That is, control determines if no codeword remains to be decoded. Control ends at 1030 if S(i+1)=0. At 1032, if S(i+1) is not a null set, control determines if a criterion to stop decoding is met. For example only, the criterion may be based on complexity, delay, etc. due to decoding. Control ends at 1030 if the criterion is met. If the criterion is not yet met, control increments the iteration counter i=i+1 at 1027, and control returns to 1008.

At 1018, if K(i)=0, i.e., if none of the codewords from the subset P(i) satisfies the predetermined reliability threshold, control determines if Q(i)=S(i) at 1034. Control ends at 1030 if Q(i)=S(i). If Q(i) is not equal to S(i), control regenerates feedback and cancels interference at 1036 although none of the codewords from the subset P(i) satisfies the predetermined reliability threshold. At 1038, control removes K"(i) codewords from the set S(i) so that S(i+1)=S(i)\{$q_{n1}$, $q_{n2}$, . . . , $q_{nK''(i)}$}, where 0≤K"(i)≤M(i). No codewords are removed if K"(i)=0 is selected. Control increments the iteration counter i=i+1 at 1027, and control returns to 1008.

The teachings of the present disclosure can be extended and applied to other systems. For example, in systems using automatic repeat request (ARQ) or hybrid ARQ (HARQ) based error control, a receiver may perform HARQ combining before performing decoding according to the present disclosure. In $3^{rd}$ generation partnership project (3GPP) long term evolution (LTE) systems, a codeword includes one or more concatenated code blocks, and each code block includes CRC. The teachings of the present disclosure can be applied to the 3GPP LTE systems by treating each code block as a codeword and by decoding code blocks serially or in parallel. The teachings of the present disclosure can also be applied to systems that use hard decoding instead of or in addition to LLR-based soft decoding. Additional implementations and extensions to other systems are contemplated.

As used herein, the phrase at least one of A, B, and C should be construed to mean a logical (A or B or C), using a non-exclusive logical OR. One or more steps within a method may be executed in different order (or concurrently) without altering the principles of the present disclosure. The term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
   a first receiver module configured to
      receive a first signal including a first set of codewords, and
      generate a first set of decoded codewords by decoding one or more codewords of the first set of codewords;
   a first interference canceller module configured to
      measure first reliability metrics of codewords corresponding to the first set of decoded codewords, and
      select a second set of decoded codewords from the first set of decoded codewords based on the first reliability metrics;
   an encoder module configured to generate an encoded signal by encoding the second set of decoded codewords;
   a modulator module configured to generate a second signal by modulating the encoded signal; and
   a subtractor module configured to subtract a portion of the second signal from the first signal to cancel interference of first codewords corresponding to the second set of decoded codewords on codewords other than the first codewords in the first set of codewords in the first signal.

2. The system of claim 1, wherein the first reliability metrics are based on at least one of (i) a first error rate, (ii) a first signal-to-noise ratio, and (iii) a first CRC check associated with the first set of decoded codewords.

3. The system of claim 1, wherein the first interference canceller module is configured to subtract the second signal from the first signal based on a comparison of the first reliability metrics to a predetermined threshold.

4. The system of claim 3, wherein the predetermined threshold is based on one or more of (i) a coding rate of the encoder module, (ii) a type of modulation used by the modulator module, and (iii) a quality of service requirement associated with the first set of codewords.

5. The system of claim 1, wherein the first interference canceller module is configured to scale the second signal using a scaling factor based on the first reliability metrics and subtract the scaled second signal from the first signal.

6. The system of claim 5, wherein the scaling factor is based on one or more of (i) a coding rate of the encoder module, (ii) a type of modulation used by the modulator module, and (iii) a quality of service requirement associated with the first set of codewords.

7. The system of claim 1, further comprising:
   a second receiver module configured to
      receive a third signal from the first interference canceller module, wherein the third signal includes a second set of codewords, and wherein the second set of codewords includes codewords other than the first codewords in the first set of codewords; and
      generate a third set of decoded codewords by decoding one or more codewords of the second set of codewords; and
   a second interference canceller module configured to
      measure second reliability metrics of codewords corresponding to the third set of decoded codewords,
      select a fourth set of decoded codewords from the third set of decoded codewords based on the second reliability metrics,
      generate a fourth signal based on the fourth set of decoded codewords, and subtract a portion of the fourth signal from the third signal to cancel interference of second codewords corresponding to the fourth set of decoded codewords on a third set of codewords in the third signal,
    wherein the third set of codewords (i) includes the second set of codewords and (ii) excludes the second codewords corresponding to the fourth set of decoded codewords.

8. The system of claim 1, wherein the first receiver module is configured to receive the first signal via a plurality of antennas arranged in a multiple-input multiple-output configuration.

9. The system of claim 1, wherein:
    the first receiver module includes a plurality of decoder modules configured to decode the one or more codewords of the first set of codewords in parallel; and
    a number of decoder modules in the plurality of decoder modules is equal to a number of codewords in the first set of codewords.

10. The system of claim 1, wherein the first interference canceller module is configured to generate the second signal in response to one or more codewords of the first set of decoded codewords not satisfying a predetermined reliability threshold.

11. A method comprising:
    receiving a first signal including a first set of codewords;
    generating a first set of decoded codewords by decoding one or more codewords of the first set of codewords;
    measuring first reliability metrics of codewords corresponding to the first set of decoded codewords;
    selecting a second set of decoded codewords from the first set of decoded codewords based on the first reliability metrics;
    generating an encoded signal by encoding the second set of decoded codewords;
    generating a second signal by modulating the encoded signal; and
    subtracting a portion of the second signal from the first signal to cancel interference of first codewords corresponding to the second set of decoded codewords on codewords other than the first codewords in the first set of codewords in the first signal.

12. The method of claim 11, wherein the first reliability metrics are based on at least one of (i) a first error rate, (ii) a first signal-to-noise ratio, and (iii) a first CRC check associated with the first set of decoded codewords.

13. The method of claim 11, further comprising:
    comparing the first reliability metrics to a predetermined threshold; and
    subtracting the second signal from the first signal based on the comparison.

14. The method of claim 13, further comprising selecting the predetermined threshold based on one or more of (i) a coding rate, (ii) a type of modulation, and (iii) a quality of service requirement associated with the first set of codewords.

15. The method of claim 11, further comprising:
    scaling the second signal using a scaling factor based on the first reliability metrics; and
    subtracting the scaled second signal from the first signal.

16. The method of claim 15, further comprising selecting the scaling factor based on one or more of (i) a coding rate, (ii) a type of modulation, and (iii) a quality of service requirement associated with the first set of codewords.

17. The method of claim 11, further comprising:
    receiving a third signal including a second set of codewords, and wherein the second set of codewords includes codewords other than the first codewords in the first set of codewords;
    generating a third set of decoded codewords by decoding one or more codewords of the second set of codewords;
    measuring second reliability metrics of codewords corresponding to the third set of decoded codewords;
    selecting a fourth set of decoded codewords from the third set of decoded codewords based on the second reliability metrics;
    generating a fourth signal based on the fourth set of decoded codewords; and
    subtracting a portion of the fourth signal from the third signal to cancel interference of second codewords corresponding to the fourth set of decoded codewords on a third set of codewords in the third signal,
        wherein the third set of codewords (i) includes the second set of codewords and (ii) excludes the second codewords corresponding to the fourth set of decoded codewords.

18. The method of claim 11, further comprising receiving the first signal via a plurality of antennas arranged in a multiple-input multiple-output configuration.

19. The method of claim 11, further comprising performing the decoding of the one or more codewords of the first set of codewords in parallel.

20. The method of claim 11, further comprising generating the second signal in response to one or more codewords of the first set of decoded codewords not satisfying a predetermined reliability threshold.

* * * * *